(12) United States Patent
Jo et al.

(10) Patent No.: US 12,213,345 B2
(45) Date of Patent: Jan. 28, 2025

(54) DISPLAY APPARATUS

(71) Applicant: Samsung Display Co., Ltd., Yongin-Si (KR)

(72) Inventors: Junyoung Jo, Yongin-si (KR); Haeyeon Lee, Yongin-si (KR); Yunkyeong In, Yongin-si (KR); Hyunji Cha, Yongin-si (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 399 days.

(21) Appl. No.: 17/528,220

(22) Filed: Nov. 17, 2021

(65) Prior Publication Data

US 2023/0006007 A1 Jan. 5, 2023

(30) Foreign Application Priority Data

Jun. 30, 2021 (KR) .................. 10-2021-0085764

(51) Int. Cl.
*H10K 59/122* (2023.01)
*H10K 50/86* (2023.01)
*H10K 59/121* (2023.01)

(52) U.S. Cl.
CPC ......... *H10K 59/122* (2023.02); *H10K 50/865* (2023.02); *H10K 59/1213* (2023.02)

(58) Field of Classification Search
CPC ................. H10K 59/12; H10K 59/121; H10K 2102/302; H10K 59/122; H10K 59/65; H10K 50/8428; G02F 1/1339; G02F 1/13394; G02F 1/1679
See application file for complete search history.

(56) References Cited

U.S. PATENT DOCUMENTS

2017/0221971 A1* 8/2017 Shen .................. H10K 59/8723
2018/0013092 A1 1/2018 Park
2018/0286925 A1* 10/2018 Kim .................. H10K 59/8723
(Continued)

FOREIGN PATENT DOCUMENTS

CN 109285868 A 1/2019
CN 109285868 B * 9/2020 ......... H01L 27/3225
(Continued)

OTHER PUBLICATIONS

English translation for CN-109285868-B, Fang et al. (Year: 2019).*

*Primary Examiner* — Jonathan Y Jung
(74) *Attorney, Agent, or Firm* — Innovation Counsel LLP

(57) ABSTRACT

A display apparatus includes a substrate including a component area and a main display area, the component area including sub display areas and transmission areas, main pixel electrodes disposed in the main display area and spaced apart from each other, sub pixel electrodes disposed in the sub display areas and spaced apart from each other, a pixel definition layer covering an edge of each of the main pixel electrodes and an edge of each of the sub pixel electrodes and including transmission holes in areas corresponding to the transmission areas, main spacers disposed on the pixel definition layer in the main display area, and sub spacers disposed on the pixel definition layer in the component area, wherein a number of the sub spacers per unit area is equal to a number of the main spacers per unit area in a plan view.

20 Claims, 15 Drawing Sheets

(56) References Cited

U.S. PATENT DOCUMENTS

2019/0393283 A1   12/2019  Lu et al.
2020/0111856 A1*   4/2020  Lee .................... G06F 3/0446
2021/0036070 A1   2/2021  Jeon et al.
2021/0066642 A1   3/2021  Lee et al.
2022/0069027 A1   3/2022  Wang et al.

FOREIGN PATENT DOCUMENTS

CN         111799320 A    10/2020
KR   10-2018-0005328 A    1/2018
KR   10-2020-0039859 A    4/2020
KR   10-2021-0028319 A    3/2021

* cited by examiner

DISPLAY APPARATUS

CROSS-REFERENCE TO RELATED APPLICATION

This application is based on and claims priority under 35 U.S.C. § 119 to Korean Patent Application No. 10-2021-0085764, filed on Jun. 30, 2021, in the Korean Intellectual Property Office, the disclosure of which is incorporated by reference herein in its entirety.

BACKGROUND

1. Field

One or more embodiments relate to a display apparatus, and more particularly, to a display apparatus having a low defect in a manufacturing process and being capable of displaying a high-quality image.

2. Description of the Related Art

In general, a display apparatus is used to display an image via display elements included in a display area. Recently, various additional functions have been added to a display apparatus.

SUMMARY

However, a display apparatus of the related art has a problem in that a high-quality image may not be displayed due to added functions or a defect increases in a manufacturing process.

In order to solve various problems including the above problem, one or more embodiments include a display apparatus having a low defect in a manufacturing process and being capable of displaying a high-quality image. However, these problems are merely examples and the scope of the disclosure is not limited thereto.

Additional aspects will be set forth in part in the description which follows and, in part, will be apparent from the description, or may be learned by practice of the presented embodiments.

According to one or more embodiments, a display apparatus includes a substrate including a component area and a main display area, the component area including sub display areas and transmission areas, and the main display area at least partially surrounding the component area, main pixel electrodes disposed in the main display area and spaced apart from each other, sub pixel electrodes disposed in the sub display areas and spaced apart from each other, a pixel definition layer covering an edge of each of the main pixel electrodes and an edge of each of the sub pixel electrodes and including transmission holes in areas corresponding to the transmission areas, main spacers disposed on the pixel definition layer in the main display area, and sub spacers disposed on the pixel definition layer in the component area, wherein a number of the sub spacers per unit area is equal to a number of the main spacers per unit area in a plan view.

An area of each of the main spacers may be equal to an area of each of the sub spacers in a plan view.

A shape of a cross-section of each of the main spacers may be same as a shape of a cross-section of each of the sub spacers when viewed in the direction perpendicular to the substrate.

The main spacers may include first main spacers arranged at a certain interval from one another and second main spacers arranged at a certain interval from one another, and the first main spacers and the second main spacers may be in a one-to-one correspondence to each other.

A distance between the first main spacers may be equal to a distance between the second main spacers.

Each of the first main spacers may be disposed adjacent to a corresponding one of the second main spacers.

The sub spacers may include first sub spacers arranged at a certain interval from one another and second sub spacers arranged at a certain interval from one another, and the first sub spacers and the second sub spacers may be in a one-to-one correspondence to each other.

A distance between the first sub spacers may be equal to a distance between the second sub spacers.

A distance between each of the first sub spacers and each of the second sub spacers may be uniform.

The first sub spacers in the sub display area are disposed in areas corresponding to the first main spacers in the main display area.

The transmission holes of the pixel definition layer in the sub display area are disposed in areas corresponding to the second main spacers in the main display area.

The second main spacers in the main display area may be disposed in areas corresponding to some of the transmission holes of the pixel definition layer in the sub display area.

The display apparatus may further include an antireflection layer disposed over the main pixel electrodes and the sub pixel electrodes and including a light blocking layer and color filters, wherein the light blocking layer may include openings corresponding to the transmission holes of the pixel definition layer.

The pixel definition layer may include a light-blocking insulating material.

According to one or more embodiments, a display apparatus includes a substrate including a component area and a main display area, the component area including sub display areas and transmission areas, and the main display area at least partially surrounding the component area, main pixel electrodes disposed in the main display area and spaced apart from each other, sub pixel electrodes disposed in the sub display areas and spaced apart from each other, a pixel definition layer covering an edge of each of the main pixel electrodes and an edge of each of the sub pixel electrodes and including transmission holes corresponding to the transmission areas, main spacers disposed on the pixel definition layer in the main display area, and sub spacers disposed on the pixel definition layer in the component area, wherein an area occupied by the sub spacers per unit area in the sub display area is equal to an area occupied by the main spacers per unit area in the main display area in a plan view.

The main spacers may include first main spacers arranged at a certain interval from one another and second main spacers arranged at a certain interval from one another, and the first main spacers and the second main spacers may be in a one-to-one correspondence to each other.

Each of the first main spacers may be disposed adjacent to a corresponding one of the second main spacers.

The sub spacers may include first sub spacers arranged at a certain interval from one another and second sub spacers arranged at a certain interval from one another, and the first sub spacers and the second sub spacers may be in a one-to-one correspondence to each other.

The first main spacers in the main display area may be disposed in areas corresponding to the first sub spacers in the sub display area.

The second main spacers in the main display area may be disposed in areas corresponding to some of the transmission holes of the pixel definition layer in the sub display area.

Other aspects, features, and advantages other than those described above will become apparent from the following detailed description, the appended claims, and the accompanying drawings.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
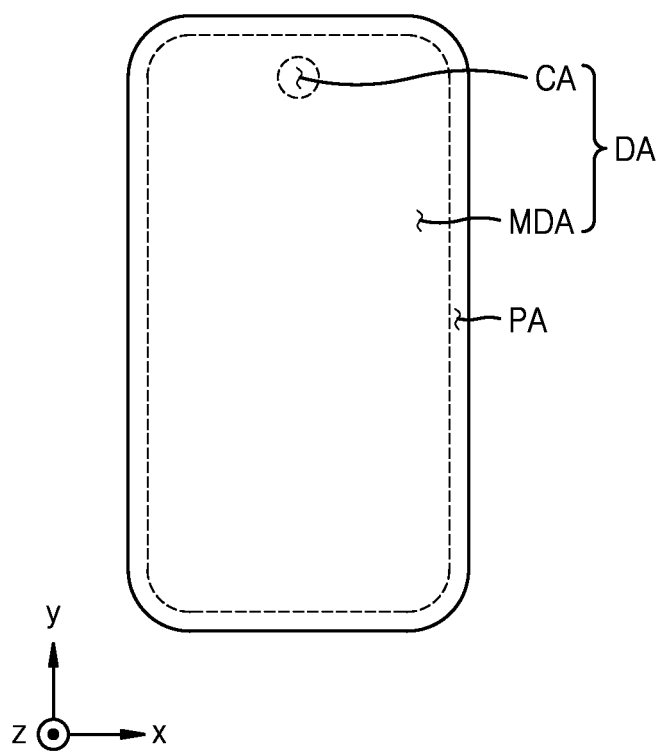
FIG. 1 is a plan view schematically illustrating a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The disclosure may include various embodiments and modifications, and certain embodiments thereof are illustrated in the drawings and will be described herein in detail. The effects and features of the disclosure and the accomplishing methods thereof will become apparent from the embodiments described below in detail with reference to the accompanying drawings. However, the disclosure is not limited to the embodiments described below and may be embodied in various modes.

Hereinafter, embodiments will be described in detail with reference to the accompanying drawings, and in the following description, like reference numerals will denote like elements and redundant descriptions thereof will be omitted for conciseness.

It will be understood that when an element such as a layer, a region, or a plate is referred to as being "on" another element, it may be "directly on" the element or may be "indirectly on" the other element with one or more intervening elements therebetween. Also, sizes of elements in the drawings may be exaggerated for convenience of description. In other words, because the sizes and thicknesses of elements in the drawings are arbitrarily illustrated for convenience of description, the disclosure is not limited thereto.

Also, herein, the x axis, the y axis, and the z axis are not limited to three axes of the rectangular coordinate system and may be interpreted in a broader sense. For example, the x axis, the y axis, and the z axis may be perpendicular to one another or may represent different directions that are not perpendicular to one another.

FIG. 1 is a plan view schematically illustrating a display apparatus according to an embodiment. The display apparatus according to the present embodiment may be an electronic apparatus such as a smartphone, a mobile phone, a navigation apparatus, a game machine, a television (TV), a vehicle head unit, a notebook computer, a laptop computer, a tablet computer, a personal media player (PMP), and a personal digital assistant (PDA). Also, the electronic apparatus may be a flexible apparatus.

The display apparatus may include a display area DA and a peripheral area PA outside the display area DA. In the plan view, the display area DA may have a substantially rectangular shape as illustrated in FIG. 1. However, the disclosure is not limited thereto, and the display area DA may have polygonal shapes such as triangular shapes, pentagonal shapes, and hexagonal shapes, circular shapes, elliptical shapes, or atypical shapes. A corner of the edge of the display area DA may have a round shape. The peripheral area PA may be a non-display area in which display elements are not arranged. The display area DA may be entirely surrounded by the peripheral area PA.

Pixels including various display elements such as organic light emitting diodes OLED may be arranged in the display area DA. The pixels may be arranged in various forms such as stripe arrangement, pentile arrangement, or mosaic arrangement in the x-axis direction and the y-axis direction to display an image.

The display area DA may include a main display area MDA and a component area CA. The main display area MDA may have a shape surrounding the component area CA. However, the disclosure is not limited thereto, and for example, a portion of the component area CA may contact the peripheral area PA according to various modifications. That is, the main display area MDA may at least partially surround the component area CA.

As described below with reference to FIGS. 3 and 4, a component 40 (see FIGS. 3 and 4) which is an electronic element may be arranged under a display panel 10 to correspond to the component area CA. The component area CA may include a transmission area TA through which light and/or sound output from the component 40 to the outside or propagating from the outside toward the component 40 may be transmitted.

The component 40 may include an electronic element using light or sound. For example, the electronic element may include a sensor (e.g., as a proximity sensor) for measuring a distance, a sensor for recognizing a portion of a user's body (e.g., a fingerprint, an iris, or a face), a small lamp for outputting light, an illuminance sensor for measuring brightness, or an image sensor (e.g., a camera) for capturing an image. The electronic element using light may use light of various wavelength bands such as visible light, infrared light, or ultraviolet light. The electronic element using sound may use ultrasound or sound of other frequency bands. In some embodiments, the component 40 may include subcomponents such as a light emitter and a light receiver. The component 40 may include a light emitter and a light receiver integrated with each other or may include a pair of light emitter and light receiver physically separated from each other.

In the case of the display apparatus according to an embodiment, when light is transmitted through the component area CA, the light transmittance thereof may be about 10% or more, about 20% or more, about 30% or more, about 40% or more, about 50% or more, about 60% or more, about 70% or more, about 75% or more, about 80% or more, about 85% or more, or about 90% or more.

When viewed in the direction (the z-axis direction) substantially perpendicular to the upper surface of the display apparatus, the component area CA may have polygonal shapes such as triangular shapes, tetragonal shapes, pentagonal shapes, or hexagonal shapes, circular shapes, elliptical shapes, star shapes, or atypical shape.

Figure 2:
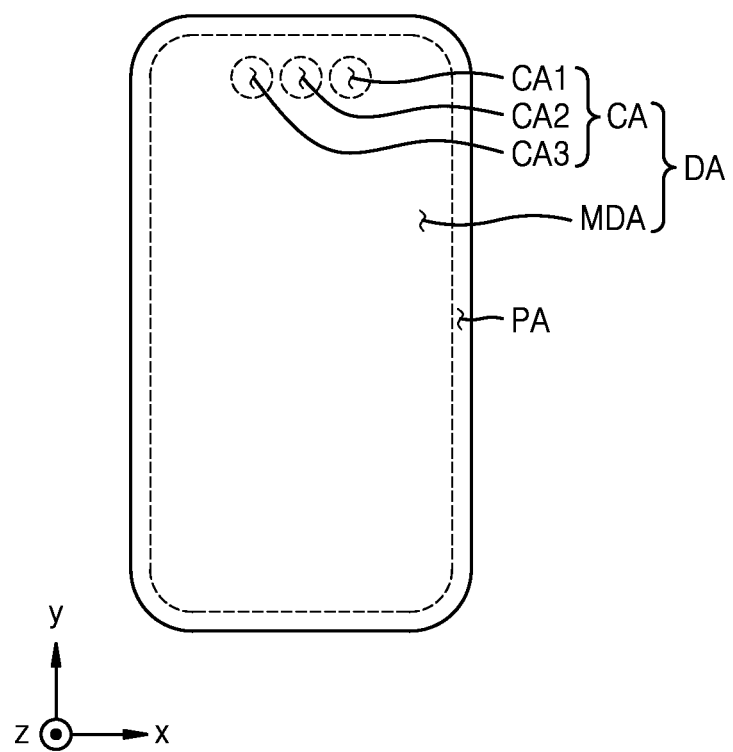
FIG. 2 is a plan view schematically illustrating a display apparatus according to an embodiment.

FIG. 1 illustrates that the display area DA includes one component area CA. However, the disclosure is not limited thereto. For example, as illustrated in FIG. 2 that is a plan view schematically illustrating a display apparatus according to another embodiment, the component area CA may include a plurality of subcomponent areas CA1, CA2, and CA3 spaced apart from each other. The sizes of the plurality of subcomponent areas CA1, CA2, and CA3 may be different from each other when necessary.

When the component area CA includes a plurality of subcomponent areas CA1, CA2, and CA3, components 40 having different functions may be arranged to respectively correspond to the subcomponent areas CA1, CA2, and CA3. For example, a camera may be arranged under the display panel 10 to correspond to a first subcomponent area CA1, an illuminance sensor may be arranged under the display panel 10 to correspond to a second subcomponent area CA2, and a proximity sensor may be arranged under the display panel 10 to correspond to a third subcomponent area CA3.

Figure 3:
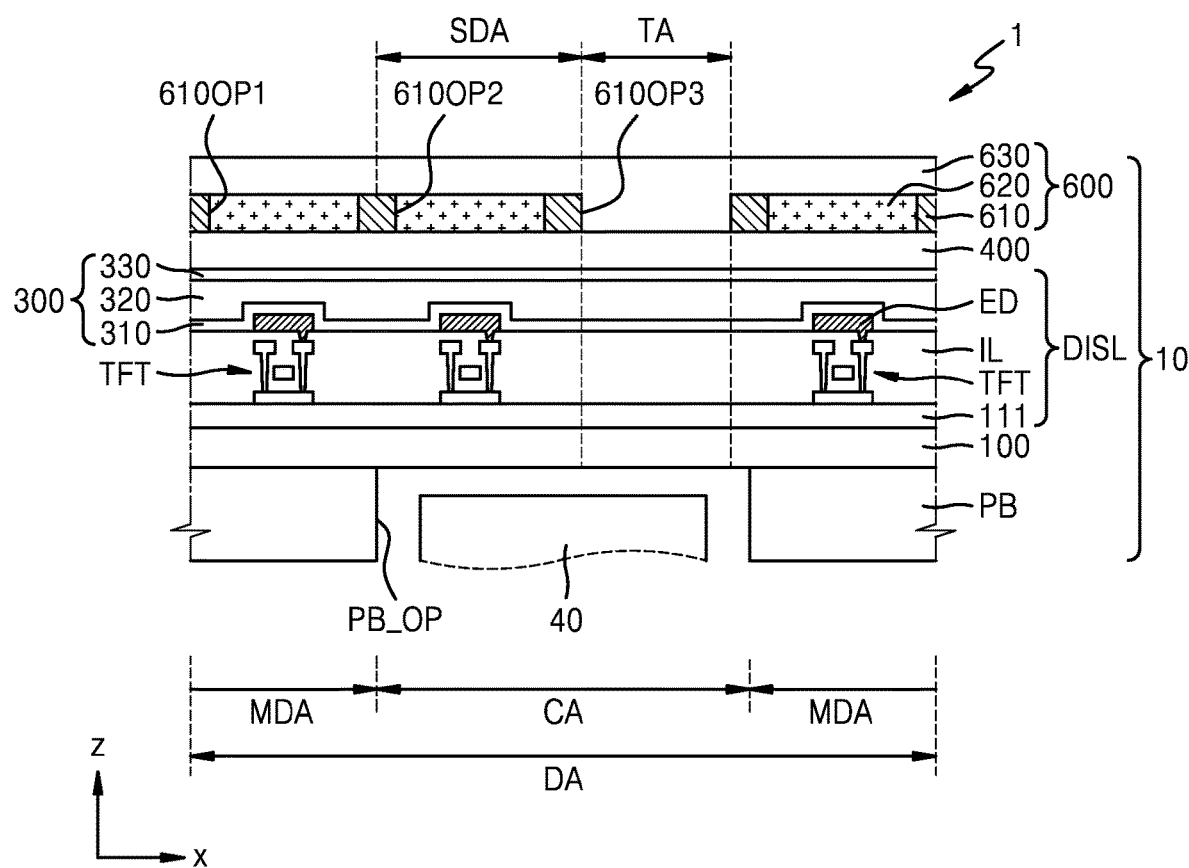
FIG. 3 is a cross-sectional view schematically illustrating a portion of the display apparatus of FIG. 1.

FIG. 3 is a cross-sectional view schematically illustrating a portion of the display apparatus of FIG. 1. As illustrated in FIG. 3, a display apparatus 1 may include a display panel 10 and a component 40 arranged to overlap the display panel 10. A cover window (not illustrated) for protecting the display panel 10 may be disposed over the display panel 10.

A display area DA of the display panel 10 may include a component area CA and a main display area MDA. A main image may be displayed in the main display area MDA, and an auxiliary image may be displayed in the component area CA. The component 40 may be arranged under the display panel 10 to correspond to the component area CA. That is, the component area CA may overlap the component 40 when viewed in the direction (the z-axis direction) substantially perpendicular to the upper surface of the display apparatus 1.

The display panel 10 may include a substrate 100, a display layer DISL disposed over the substrate 100, a touch screen layer 400, an antireflection layer 600, and a panel protection layer PB arranged under the substrate 100.

The substrate 100 may include glass, metal, or polymer resin. When the display panel 10 is flexible or bendable, the substrate 100 may include, for example, a polymer resin such as polyethersulfone, polyacrylate, polyetherimide, polyethylene naphthalate, polyethylene terephthalate, polyphenylene sulfide, polyarylate, polyimide, polycarbonate, and cellulose acetate propionate. The substrate 100 may be variously modified such as including a multilayer structure including two layers, including the polymer resin and a barrier layer located between the two layers, and including an inorganic material (e.g., silicon oxide, silicon nitride, or silicon oxynitride).

The display layer DISL located over the substrate 100 may include a pixel circuit including thin film transistors TFT, a light emitting element ED as a display element, and a thin film encapsulation layer 300. FIG. 3 illustrates that the display layer DISL includes a buffer layer 111 and a thin film transistor TFT or the like disposed over the buffer layer 111. The light emitting element ED may be an organic light emitting diode OLED. The pixel circuit including the thin film transistors TFT may control the state of light emission of the display element ED, the level of the light emission, or the like.

Light emitting elements ED may be located not only in the main display area MDA but also in the component area CA. That is, the component area CA may include sub display areas SDA and transmission areas TA, and light emitting elements ED may be arranged in the sub display areas SDA. The transmission area TA may be defined as an area in which the light emitting elements ED are not arranged in the component area CA. The transmission area TA may be an area through which the light/signal output from the component 40 or the light/signal input to the component 40 arranged to correspond to the component area CA is transmitted.

Display elements such as light emitting elements ED may be covered by the thin film encapsulation layer 300 as illustrated in FIG. 3. Alternatively, the display elements may be covered by an encapsulation substrate. The thin film encapsulation layer 300 may include at least one inorganic encapsulation layer and at least one organic encapsulation layer as illustrated in FIG. 3. For example, the thin film encapsulation layer 300 may include a first inorganic encapsulation layer 310, a second inorganic encapsulation layer 330, and an organic encapsulation layer 320 disposed therebetween.

The first inorganic encapsulation layer 310 and the second inorganic encapsulation layer 330 may include one or more inorganic insulating materials such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide (ZnO or $ZnO_2$) and may be formed by chemical vapor deposition (CVD) or the like. The organic encapsulation layer 320 may include a polymer-based material. The polymer-based material may include silicon-based resin, acryl-based resin (e.g., polymethylmethacrylate or polyacrylic acid), epoxy-based resin, polyimide, or polyethylene.

Each of the first inorganic encapsulation layer 310, the organic encapsulation layer 320, and the second inorganic encapsulation layer 330 may be integrally formed as a single body to cover the main display area MDA and the component area CA.

The touch screen layer 400 may be configured to obtain coordinate information according to an external input, for example, a touch event. The touch screen layer 400 may include a touch electrode and touch sensing lines connected to the touch electrode. The touch screen layer 400 may sense an external input by using a self-capacitance method or a mutual capacitance method.

The touch screen layer 400 may be formed over the thin film encapsulation layer 300. Alternatively, the touch screen layer 400 may be separately formed over a touch substrate and then attached to the thin film encapsulation layer 300 through an adhesive layer such as an optical clear adhesive (OCA). In an embodiment, the touch screen layer 400 may be directly formed over the thin film encapsulation layer 300, and in this case, an adhesive layer may not be disposed between the touch screen layer 400 and the thin film encapsulation layer 300.

The antireflection layer 600 may be configured to reduce the reflection of light (external light) incident from the outside toward the display apparatus 1. The antireflection layer 600 may include a light blocking layer 610, color filters 620, and an overcoat layer 630. The light blocking layer 610 may include a first opening 610OP1 overlapping the light emitting element ED arranged in the main display area MDA and a second opening 610OP2 overlapping the light emitting element ED arranged in the sub display area SDA, and the color filters 620 may be arranged in the first opening 610OP1 and the second opening 610OP2. The light blocking layer 610 may include a third opening 610OP3 not overlapping the light emitting element ED. The third opening 610OP3 may be an area corresponding to the transmission area TA in the component area CA, and a portion of the overcoat layer 630 may be disposed in the third opening 610OP3. That is, the color filter 620 and the light blocking layer 610 may not be in a portion of the antireflection layer 600 corresponding to the transmission area TA in the component area CA.

The color filter 620 may be arranged considering the color of light emitted from each of the pixels of the display panel 10. For example, the color filter 620 may have a red, green, or blue color depending on the color of light emitted from the light emitting element ED. The overcoat layer 630 may include an organic material such as resin and may be transparent.

As such, in the case of a display apparatus 1 including the antireflection layer 600 including the color filter 620 and the light blocking layer 610, the thickness of the display apparatus may be greatly reduced compared to a display apparatus 1 including a polarization plate in order to reduce the reflectance of external light.

A window (not illustrated) may be disposed over the display panel 10, that is, over the antireflection layer 600, to protect the display panel 10. The window may be coupled to the antireflection layer 600 through an adhesive layer such as an optically transparent adhesive. The window may include a glass material or a plastic material. The glass material may include ultra-thin glass. The plastic material may include polyethersulfone, polyacrylate, polyetherimide, polyethylene naphthalate, polyethylene terephthalate, polyphenylene sulfide, polyarylate, polyimide, polycarbonate, or cellulose acetate propionate.

The panel protection layer PB may be attached under the substrate 100 to support and protect the substrate 100. The panel protection layer PB may include an opening PB_OP corresponding to the component area CA. Because the panel protection layer PB includes the opening PB_OP, the light transmittance of the component area CA may be improved. The panel protection layer PB may include polyethylene terephthalate or polyimide.

The area of the component area CA may be greater than the area where the component 40 is arranged. Accordingly, the area of the opening PB_OP in the panel protection layer PB may not match the area of the component area CA. Moreover, although FIG. 3 illustrates that at least a portion of the component 40 is inserted into the opening PB_OP in the panel protection layer PB, the component 40 may be arranged spaced apart from the display panel 10.

Figure 4:
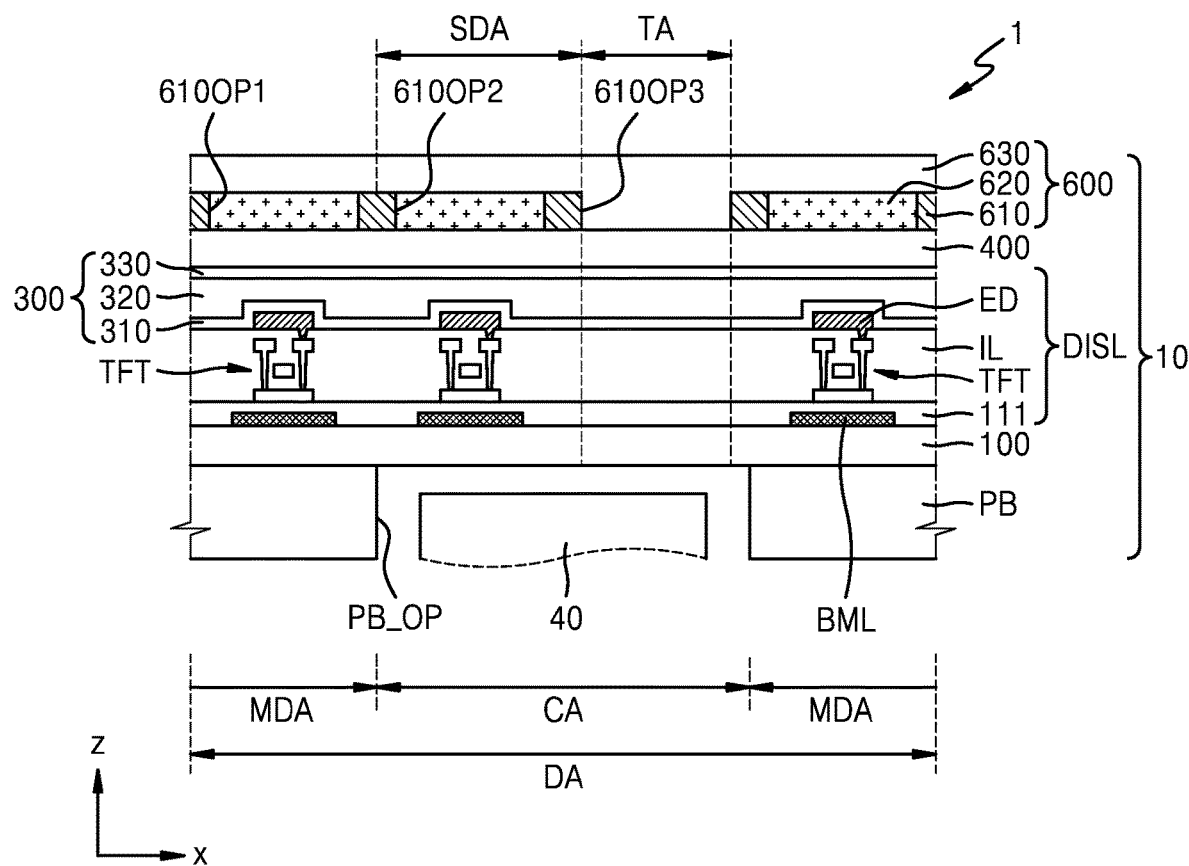
FIG. 4 is a cross-sectional view schematically illustrating a portion of a display apparatus according to an embodiment.

Moreover, as illustrated in FIG. 4 that is a cross-sectional view schematically illustrating a portion of a display apparatus according to an embodiment, the display panel 10 may further include a bottom metal layer BML. FIG. 4 illustrates that the bottom metal layer BML is arranged between the substrate 100 and the buffer layer 111. The bottom metal layer BML may be arranged to overlap the pixel circuits in a plan view to protect the pixel circuits. Although FIG. 4 illustrates that the bottom metal layer BML is located under the thin film transistor TFT, the disclosure is not limited thereto. The bottom metal layer BML may be located under the pixel circuit including the thin film transistor TFT.

The bottom metal layer BML may be configured to prevent or minimize the influence of light on the pixel circuits. The bottom metal layer BML may only be located in the component area CA or may be located in the component area CA and the main display area MDA. The bottom metal layer BML arranged in the component area CA may include an opening corresponding to the transmission area TA.

Figure 5:
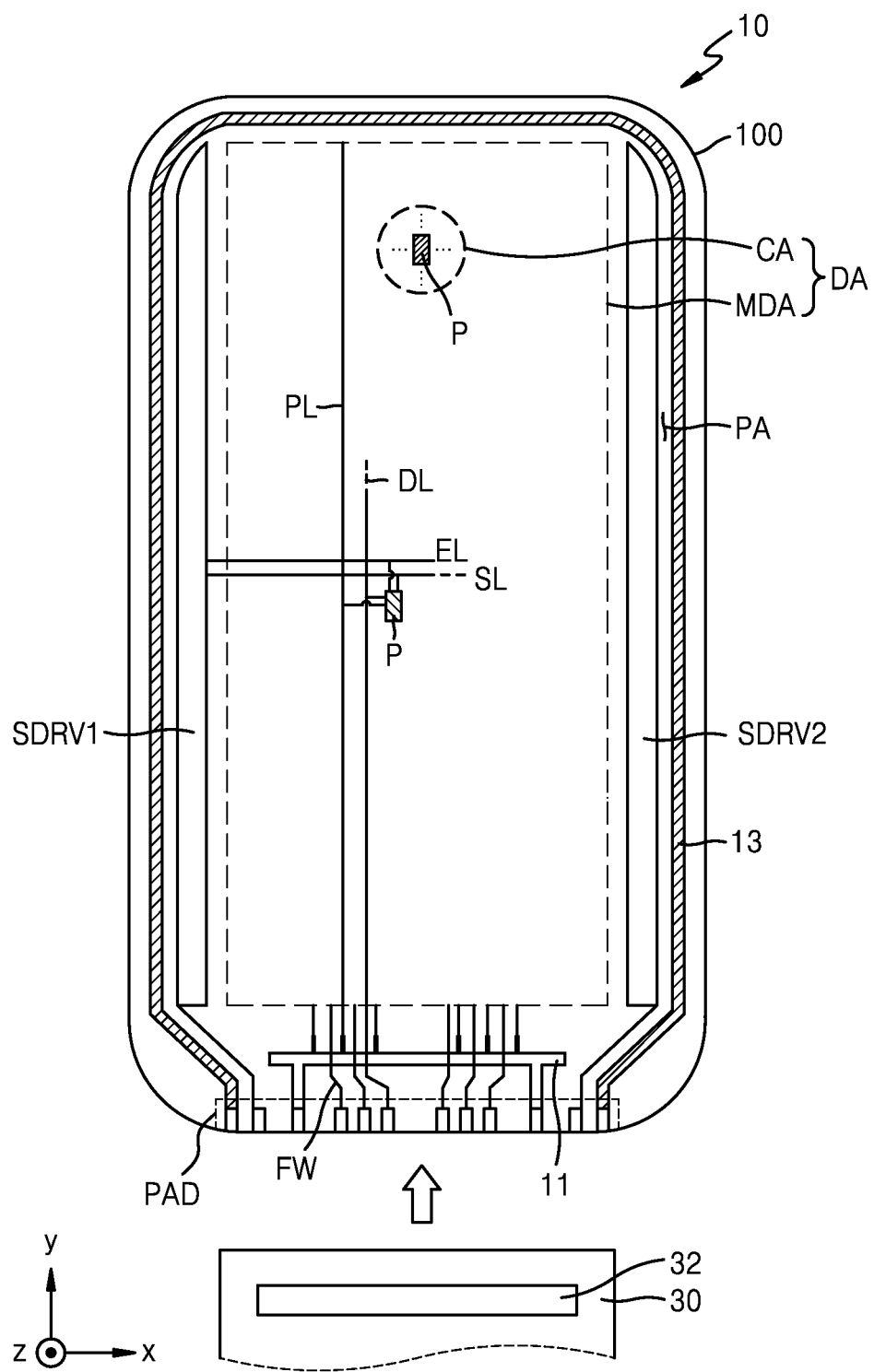
FIG. 5 is a plan view schematically illustrating a display apparatus according to an embodiment.

FIG. 5 is a plan view schematically illustrating a display panel included in a display apparatus according to an embodiment. As illustrated in FIG. 5, various components included in the display panel 10 may be disposed over a substrate 100. The substrate 100 may include a display area DA and a peripheral area PA surrounding the display area DA. The display area DA may include a main display area MDA and a component area CA as described above.

A plurality of pixels P may be arranged in the main display area MDA and the component area CA. Each of the pixels P may include a display element such as an organic light emitting diode OLED. Each pixel P may emit, for example, red, green, blue, or white light. The resolution of the component area CA may be equal to the resolution of the main display area MDA.

Each of pixel circuits driving the display elements may be electrically connected to peripheral circuits arranged in the peripheral area PA. A first scan driving circuit SDRV1, a second scan driving circuit SDRV2, a terminal PAD, a driving voltage supply line 11, and a common voltage supply line 13 may be arranged in the peripheral area PA.

The first scan driving circuit SDRV1 may apply a scan signal to the pixel circuit driving the display element of the pixel P through a scan line SL. The first scan driving circuit SDRV1 may also apply an emission control signal to the pixel circuit through an emission control line EL. The second scan driving circuit SDRV2 may be located on the opposite side of the first scan driving circuit SDRV1 with respect to the display area DA and may be disposed substantially parallel to the first scan driving circuit SDRV1. The pixel circuits of some of the pixels P of the display area DA may be electrically connected to the first scan driving circuit SDRV1, and the pixel circuits of the other pixels P may be electrically connected to the second scan driving circuit SDRV2. When necessary, the second scan driving circuit SDRV2 may be omitted.

The terminal PAD may be arranged at one side of the substrate 100. The terminal PAD may be exposed through openings formed in an insulating layer to be connected to a display circuit board 30. A display driver 32 may be disposed on the display circuit board 30.

The display driver 32 may generate a control signal to be transmitted to the first scan driving circuit SDRV1 and the second scan driving circuit SDRV2. The display driver 32 may generate a data signal, and the generated data signal may be transmitted to the pixel circuits of the pixels P through a fanout line FW and a data line DL connected to the fanout line FW.

The display driver 32 may supply a driving voltage ELVDD to the driving voltage supply line 11 and may supply a common voltage ELVSS to the common voltage supply line 13. The driving voltage ELVDD may be applied to the pixel circuits of the pixels P through a driving voltage line PL connected to the driving voltage supply line 11, and the common voltage ELVSS may be applied to an opposite electrode of the display element through the common voltage supply line 13.

The driving voltage supply line 11 may be connected to the terminal PAD and may extend in the x direction under the display area DA. The common voltage supply line 13 may be connected to the terminal PAD and may have a loop shape in which one side is open to partially surround the display area DA.

Figure 6:
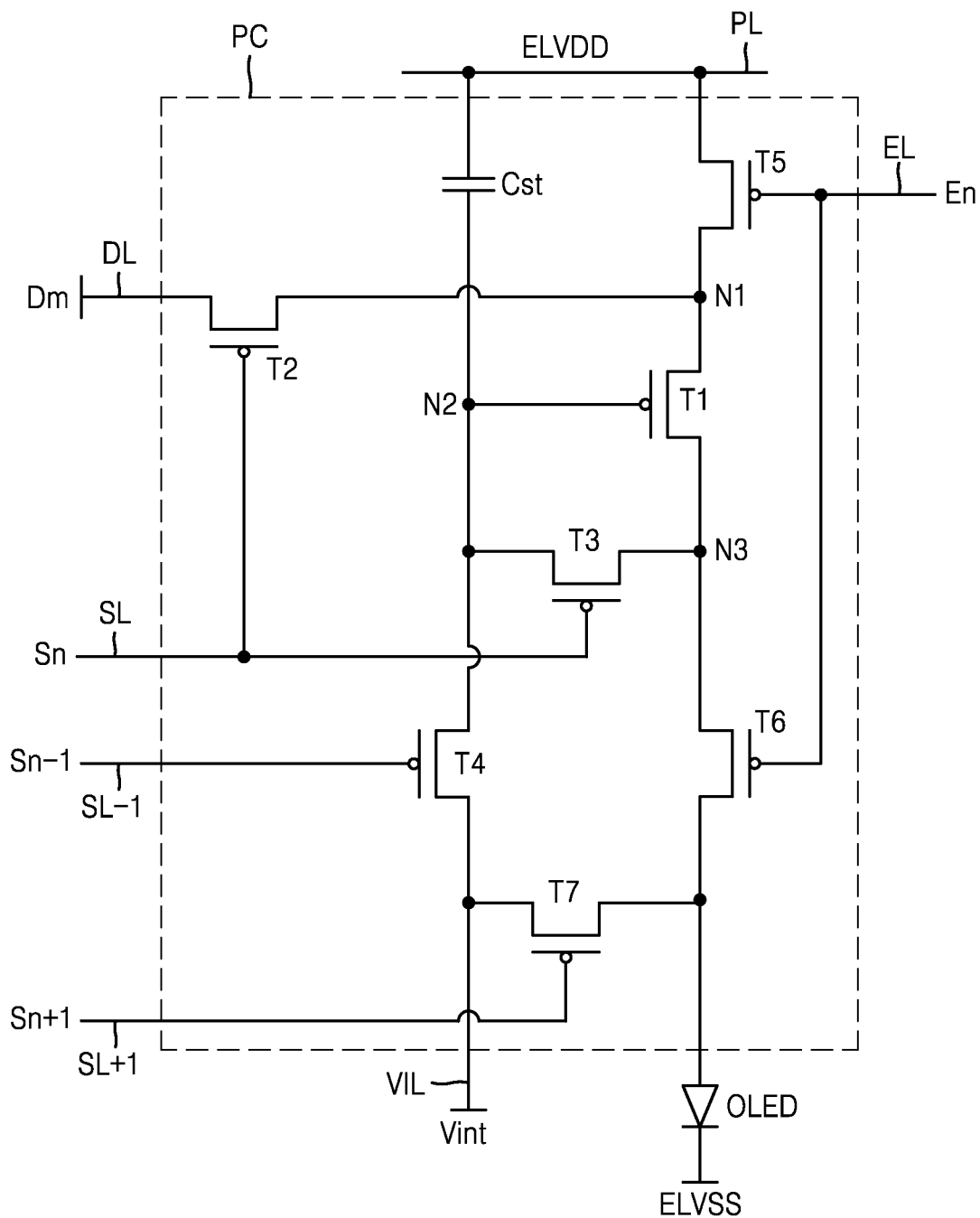
FIG. 6 is an equivalent circuit diagram of a pixel included in the display apparatus of FIG. 1.

FIG. 6 is an equivalent circuit diagram of a pixel included in the display apparatus of FIG. 1. As illustrated in FIG. 6, a pixel circuit PC may be electrically connected to a light emitting element as a display element to control the state of light emission of the light emitting element or the level of the light emission. The light emitting element may be an organic light emitting diode OLED. The pixel circuit PC may include first to seventh transistor T1 to T7. Depending on the transistor type (p-type or n-type) and/or operation condition thereof, a first terminal of each of the first to seventh transistors T1 to T7 may be one of a source terminal and a drain terminal, and a second terminal thereof may be a terminal different from the first terminal. For example, when the first terminal is a source terminal, the second terminal may be a drain terminal.

The pixel circuit PC may be connected to a first scan line SL configured to transmit a first scan signal Sn, a second scan line SL−1 configured to transmit a second scan signal Sn−1, a third scan line SL+1 configured to transmit a third scan signal Sn+1, an emission control line EL configured to transmit an emission control signal En, a data line DL configured to transmit a data signal Dm, a driving voltage line PL configured to transmit a driving voltage ELVDD, and an initialization voltage line VIL configured to transmit an initialization voltage Vint.

The first transistor T1 may be connected between the driving voltage line PL and the organic light emitting diode OLED. The first transistor T1 may be connected to the driving voltage line PL via the fifth transistor T5 and may be electrically connected to the organic light emitting diode OLED via the sixth transistor T6. The first transistor T1 may include a gate terminal connected to a second node N2, a first terminal connected to a first node N1, and a second terminal connected to a third node N3. The first transistor T1 may function as a driving transistor and may receive the data signal Dm according to a switching operation of the second transistor T2 to supply a driving current to the light emitting element.

The second transistor T2 as a switching transistor may be connected between the data line DL and the first node N1 and may be connected to the driving voltage line PL via the fifth transistor T5. The first node N1 may be a node to which the first transistor T1 and the fifth transistor T5 are connected. The second transistor T2 may include a gate terminal connected to the first scan line SL, a first terminal connected to the data line DL, and a second terminal connected to the first node N1 (or the first terminal of the first transistor T1). The second transistor T2 may be turned on in response to the first scan signal Sn received through the first scan line SL to perform a switching operation of transmitting the data signal Dm received through the data line DL to the first node N1.

The third transistor T3 as a compensation transistor may be connected between the second node N2 and the third node N3. The third transistor T3 may be connected to the organic light emitting diode OLED via the sixth transistor T6. The second node N2 may be a node to which the gate electrode of the first transistor T1 is connected, and the third node N3 may be a node to which the first transistor T1 and the sixth transistor T6 are connected. The third transistor T3 may include a gate terminal connected to the first scan line SL, a first terminal connected to the second node N2 (or the gate terminal of the first transistor T1), and a second terminal connected to the third node N3 (or the second terminal of the first transistor T1). The third transistor T3 may be turned on in response to the first scan signal Sn received through the first scan line SL to diode-connect the first transistor T1 to compensate for the threshold voltage of the first transistor T1. The third transistor T3 may have a structure in which two or more transistors are connected in series.

The fourth transistor T4 as a first initialization transistor may be connected between the second node N2 and the initialization voltage line VIL. The fourth transistor T4 may include a gate terminal connected to the second scan line SL−1, a first terminal connected to the second node N2, and a second terminal connected to the initialization voltage line VIL. The fourth transistor T4 may be turned on in response to the second scan signal Sn−1 received through the second scan line SL−1 to transmit the initialization voltage Vint to the gate terminal of the first transistor T1 to initialize the gate voltage of the first transistor T1.

The fifth transistor T5 as an operation control transistor may be connected between the driving voltage line PL and the first node N1. The sixth transistor T6 as an emission control transistor may be connected between the third node N3 and the organic light emitting diode OLED. The fifth transistor T5 may include a gate terminal connected to the emission control line EL, a first terminal connected to the driving voltage line PL, and a second terminal connected to the first node N1. The sixth transistor T6 may include a gate terminal connected to the emission control line EL, a first terminal connected to the third node N3, and a second terminal connected to a pixel electrode of the organic light emitting diode OLED. The fifth transistor T5 and the sixth transistor T6 may be simultaneously turned on in response to the emission control signal En received through the emission control line EL and thus a driving current may flow through the organic light emitting diode OLED.

The seventh transistor T7 as a second initialization transistor may be connected between the organic light emitting diode OLED and the initialization voltage line VIL. The seventh transistor T7 may include a gate terminal connected to the third scan line SL+1, a first terminal connected to the second terminal of the sixth transistor T6 and the pixel electrode of the organic light emitting diode OLED, and a second terminal connected to the initialization voltage line VIL. The seventh transistor T7 may be turned on in response to the third scan signal Sn+1 received through the third scan line SL+1 to transmit the initialization voltage Vint to the pixel electrode of the organic light emitting diode OLED to initialize the voltage of the pixel electrode of the organic light emitting diode OLED. The seventh transistor T7 may be omitted.

A capacitor Cst may include a first electrode connected to the second node N2 and a second electrode connected to the driving voltage line PL. The capacitor Cst may be configured to maintain a voltage applied to the gate electrode of the first transistor T1 by storing and maintaining a voltage corresponding to the difference between the voltages respectively supplied to the first electrode and the second electrode. The first electrode of the capacitor Cst may be the gate terminal of the first transistor T1.

The organic light emitting diode OLED may include a pixel electrode and an opposite electrode facing the pixel electrode, and the opposite electrode may receive the common voltage ELVSS. The organic light emitting diode OLED may receive a driving current corresponding to a voltage value stored in the capacitor Cst from the first transistor T1 to emit light in a certain color to display an image. The opposite electrode may be commonly, that is, integrally, provided to a plurality of pixels.

Although FIG. 6 illustrates that each of the transistors of the pixel circuit is a P-type transistor, the disclosure is not limited thereto. For example, according to various modifications, each of the transistors may be an N-type transistor, or some of the transistors may be P-type transistors and the others may be N-type transistors.

Figure 7:
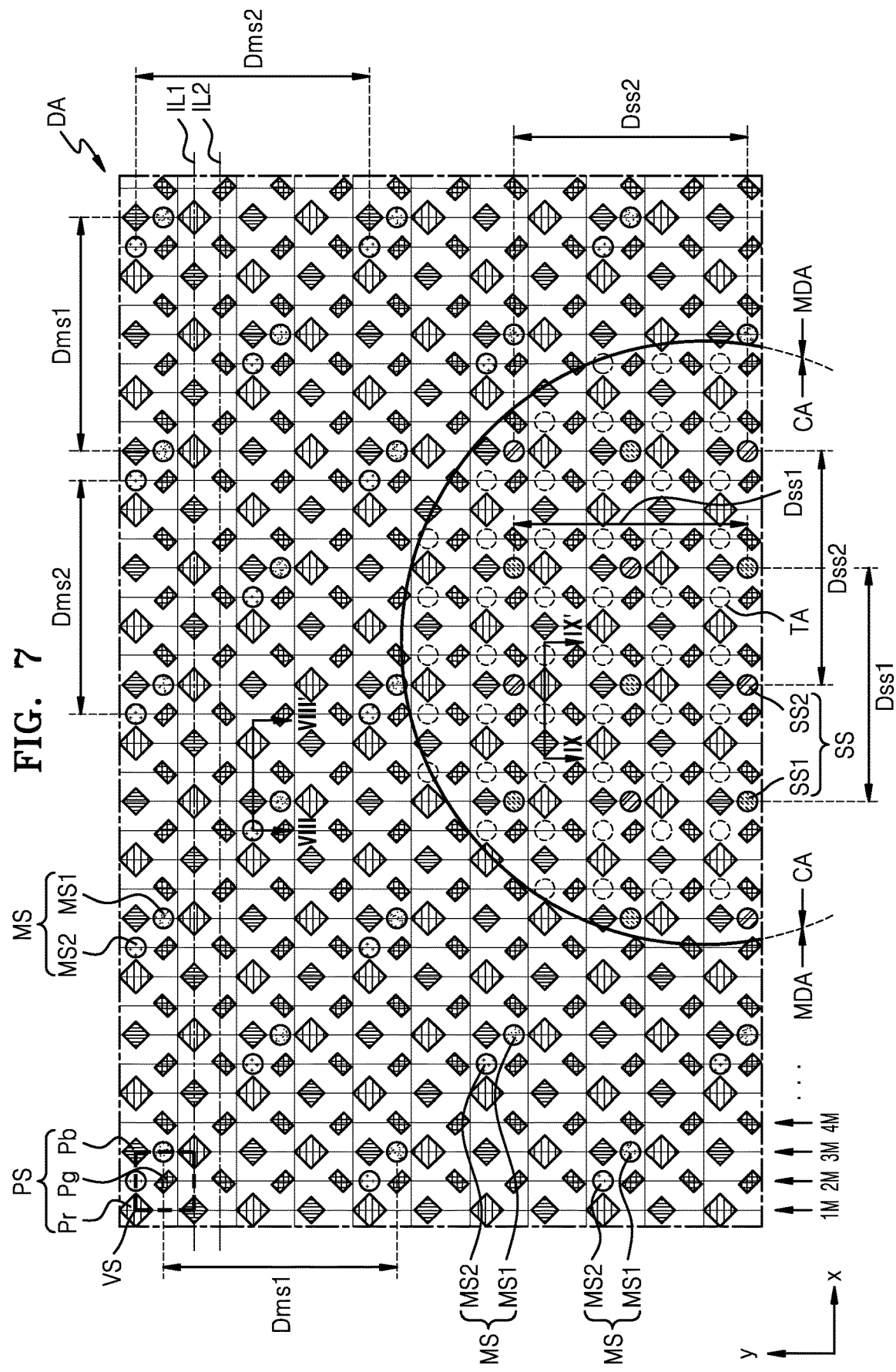
FIG. 7 is a conceptual diagram schematically illustrating a portion of a display area of the display apparatus of FIG. 1.

FIG. 7 is a conceptual diagram schematically illustrating a portion of a display area of the display apparatus of FIG. 1.

As illustrated in FIG. 7, pixel sets PS may be arranged in the main display area MDA and the component area CA. The pixel sets PS may include first to third pixels emitting light of different colors. Hereinafter, for convenience of description, it will be assumed that the first pixel is a red pixel Pr, the second pixel is a green pixel Pg, and the third pixel is a blue pixel Pb.

The red pixels Pr, the green pixels Pg, and the blue pixels Pb may be arranged in the main display area MDA and the component area CA according to a predetermined configuration.

The red pixels Pr, the green pixels Pg, and the blue pixels Pb may be alternately arranged in a first direction (the x-axis direction). For example, the red pixels Pr and the blue pixels Pb may be alternately arranged along a first virtual line IL1 extending in the first direction (the x-axis direction), and the green pixels Pg may be arranged to be spaced apart from each other along a second virtual line IL2 parallel to the first virtual line IL1 and adjacent to the first virtual line IL1. In this case, the green pixels Pg may be arranged to correspond to an area disposed between the red pixels Pr and the blue pixels Pb. The arrangement of pixels on the first virtual line IL1 and the second virtual line IL2 may be repeated in a second direction (the y-axis direction) intersecting with the first direction (the x-axis direction). In this case, the size (or width) of each of the blue pixel Pb and the red pixel Pr may be greater than the size (or width) of the green pixel Pg.

The red pixels Pr and the blue pixels Pb arranged along the first virtual line IL1 and the green pixels Pg arranged along the second virtual line IL2 may be alternately arranged. That is, the green pixels Pg may be arranged to correspond to the area disposed between the red pixels Pr and the blue pixels Pb. Thus, red pixels Pr and blue pixels Pb may be alternately arranged in a first column 1M in the second direction (the y-axis direction), green pixels Pg may be arranged to be spaced apart from each other by a certain distance in a second column 2M disposed adjacent to the first column 1M, blue pixels Pb and red pixels Pr may be alternately arranged in a third column 3M disposed adjacent to the second column 2M, and green pixels Pg may be arranged to be spaced apart from each other by a certain distance in a fourth column 4M disposed adjacent to the third column 3M. Also, the arrangement of pixels in the first to fourth columns 1M to 4M may be repeated in the first direction (the x-axis direction).

The red pixels Pr are arranged at a first vertex and a third vertex diagonally facing each other among the vertexes of a virtual square VS having a center of the green pixel Pg as a center thereof and the blue pixels Pb may be arranged at a second vertex and a fourth vertex. In this case, the virtual square VS may be variously modified into a rectangle, a rhombus, a square, or the like. Such a pixel arrangement structure may be referred to as a pentile (PenTile™) structure, and a high-resolution display apparatus may be implemented with a small number of pixels by applying a rendering drive that represents colors by sharing adjacent pixels.

Herein, the pixel may be a minimum unit for implementing an image. When an organic light emitting diode is used as a display element, an emission area of the pixel may correspond to an area of an emission layer or an opening of a pixel definition layer.

The red pixel Pr, the green pixel Pg, and the blue pixel Pb illustrated in FIG. 7 may respectively emit red, green, and blue light by using light emitting diodes. Thus, the arrangement of pixels may correspond to the arrangement of light emitting diode as display elements. For example, the position of the red pixel Pr illustrated in FIG. 7 may correspond to the position of the organic light emitting diode emitting red light. Likewise, the position of the green pixel Pg may correspond to the position of the organic light emitting diode emitting green light, and the position of the blue pixel Pb may correspond to the position of the organic light emitting diode emitting blue light.

The pixel arrangement structures of the main display area MDA and the component area CA may be the same as each other. The resolutions of the main display area MDA and the component area CA may be equal to each other. The pixel circuit structure to which the organic light emitting diode of the pixel P arranged in the main display area MDA is connected may be the same as the pixel circuit structure to which the organic light emitting diode of the pixel P arranged in the component area CA is connected.

A plurality of transmission areas TA may be regularly located at certain intervals in the component area CA. The transmission areas TA may be located between a pair of adjacent pixels, that is, between the light emitting diodes, and may not overlap the light emitting diode. In an embodiment, the transmission area TA may be located at the boundary between a pair of adjacent pixel circuit areas. A pixel circuit or circuit elements and/or lines constituting a pixel circuit may not be arranged in the transmission area TA. Accordingly, the area (size) occupied by the pixel circuit arranged in the component area CA may be less than the area (size) occupied by the pixel circuit arranged in the main display area MDA.

The transmission areas TA may be located between the pixels in the first direction (the x-axis direction) and the second direction (the y-axis direction). For example, the transmission areas TA may be located between the red pixels Pr and the blue pixels Pb in the first direction (the x-axis direction). Also, the transmission areas TA may be located between the green pixels Pg in the second direction (the y-axis direction). In this case, the transmission areas TA may not be disposed between the red pixels Pr and the blue pixels Pb in the second direction (the y-axis direction). This may be because sub spacers SS described below may be located in some of the areas between the red pixels Pr and the blue pixels Pb in the second direction (the y-axis direction).

The transmission area TA may not mean that a hole is actually formed in a substrate or an insulating layer, but may be defined as an area through which light or various signals may pass because circuit elements and/or lines are not disposed over the substrate 100 when viewed in the direction perpendicular to the upper surface of the substrate 100 due to the arrangement of circuit elements constituting the pixel circuit and lines (signal lines) connected to the pixel circuit over the substrate 100.

Each of the display element of the red pixel Pr, the display element of the green pixel Pg, and the display element of the blue pixel Pb may be disposed over the corresponding pixel circuit. The display element may be arranged directly over the pixel circuit to overlap the pixel circuit or may be arranged to partially overlap a pixel circuit of another pixel arranged in an adjacent row or column by being offset from the pixel circuit. That is, the display element of the pixel may be disposed over the corresponding pixel circuit area, or a portion thereof may be disposed over another pixel circuit area adjacent to the corresponding pixel circuit area.

Although FIG. 7 illustrates that the transmission area TA has a circular shape, the disclosure is not limited thereto. For example, the transmission area TA may have an elliptical shape or may have a polygonal shape such as a triangular shape or a pentagonal shape.

Figure 8:
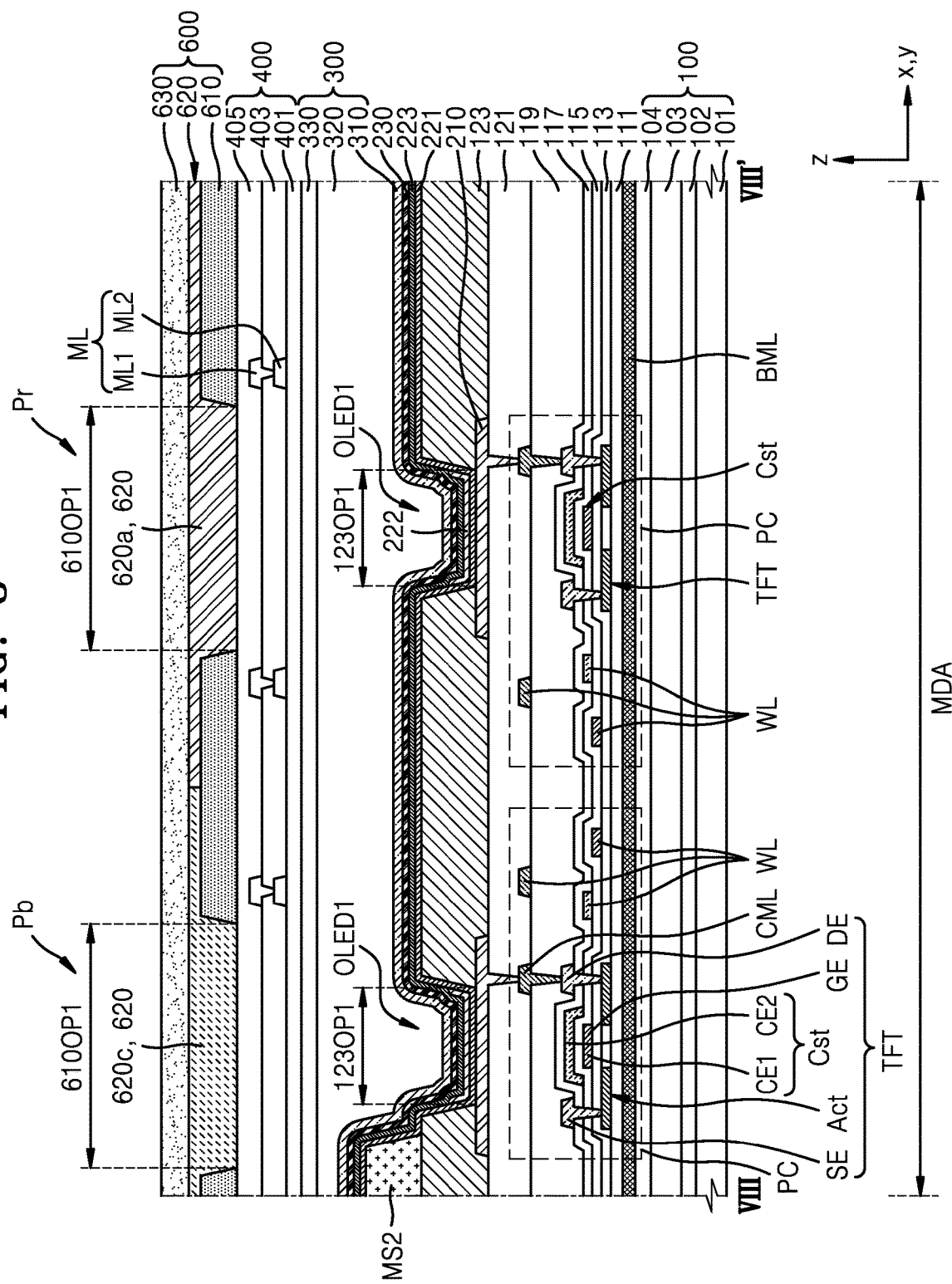
FIG. 8 is a cross-sectional view schematically illustrating a cross-section of the display apparatus of FIG. 1 taken along line VIII-VIII' of FIG. 7.
Figure 9:
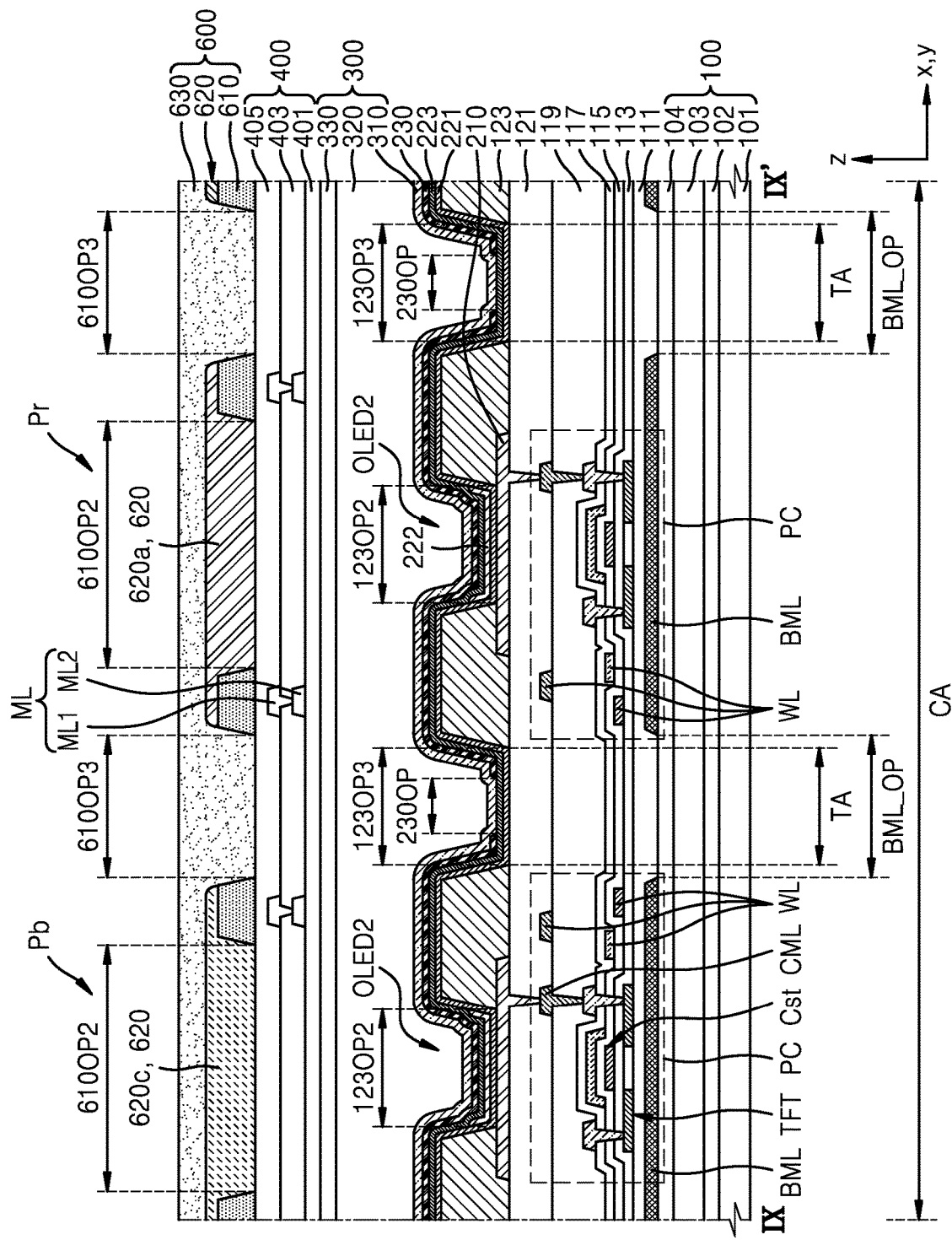
FIG. 9 is a cross-sectional view schematically illustrating a cross-section of the display apparatus of FIG. 1 taken along line IX-IX' of FIG. 7.

FIG. 8 is a cross-sectional view schematically illustrating a cross-section of the display apparatus of FIG. 1 taken along line VIII-VIII' of FIG. 7, and FIG. 9 is a cross-sectional view schematically illustrating a cross-section of the display apparatus of FIG. 1 taken along line IX-IX' of FIG. 7.

FIGS. 8 and 9 illustrate a case where a light emitting element as a display element is an organic light emitting diode. An organic light emitting diode may be arranged in each of the main display area MDA and the component area CA, and for convenience of description, the organic light emitting diode arranged in the main display area MDA will be referred to as a first organic light emitting diode OLED1 and the organic light emitting diode arranged in the component area CA will be referred to as a second organic light emitting diode OLED2.

Referring to FIGS. 8 and 9, the first organic light emitting diode OLED1 and the second organic light emitting diode OLED2 may be disposed over a substrate 100.

The substrate 100 may include a first base layer 101, a first barrier layer 102, a second base layer 103, and a second barrier layer 104. The first base layer 101 and the second base layer 103 may include a polymer resin, and each of the first barrier layer 102 and the second barrier layer 104 may include an inorganic insulating material. The polymer resin may include polyethersulfone, polyacrylate, polyetherimide, polyethylene naphthalate, polyethylene terephthalate, polyphenylene sulfide, polyarylate, polyimide, polycarbonate, or cellulose acetate propionate. The inorganic insulating material may include silicon oxide, silicon nitride, or silicon oxynitride.

A buffer layer 111 may be disposed over the substrate 100. The buffer layer 111 may prevent or minimize the penetration of foreign materials, moisture, or external air from under the substrate 100. The buffer layer 111 may include an inorganic insulating material such as silicon oxide, silicon nitride, or silicon oxynitride and may have a single-layer or multiple-layer structure including the above material.

A bottom metal layer BML may be arranged between the substrate 100 and the buffer layer 111 and may be located in the main display area MDA and the component area CA. The bottom metal layer BML may include a conductive metal such as aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu). The bottom metal layer BML may be arranged to overlap at least a portion of the pixel circuit PC in a plan view. For example, the bottom metal layer BML may overlap at least areas corresponding to driving transistors, and may have openings corresponding to the other circuit elements other than the driving transistors. The bottom metal layer BML may be located only in the component area CA or may be omitted in both the main display area MDA and the component area CA.

Each of the first organic light emitting diode OLED1 and the second organic light emitting diode OLED2 may be electrically connected to the corresponding pixel circuit PC. The first organic light emitting diode OLED1 may be electrically connected to the pixel circuit PC disposed between the substrate 100 and the first organic light emitting diode OLED1, and the second organic light emitting diode OLED2 may be electrically connected to the pixel circuit PC disposed between the substrate 100 and the second organic light emitting diode OLED2.

The pixel circuit PC may include a thin film transistor TFT and a capacitor Cst, and may include a plurality of lines WL connected to the thin film transistor TFT and the capacitor Cst when necessary. The thin film transistor TFT may include a semiconductor layer Act, a gate electrode GE overlapping a channel area of the semiconductor layer Act, a source electrode SE connected to a source area of the semiconductor layer Act, and a drain electrode DE connected to a drain area of the semiconductor layer Act. Here, the source electrode SE and the drain electrode DE may be defined as portions of lines that contact the semiconductor layer Act. Also, when a semiconductor layer Act of a thin film transistor TFT and a semiconductor layer Act of another thin film transistor TFT are directly connected to each other, a source electrode SE and/or a drain electrode DE may not be in the thin film transistors TFT.

A gate insulating layer 113 may be arranged between the semiconductor layer Act and the gate electrode GE, and a first interlayer insulating layer 115 and/or a second interlayer insulating layer 117 may be arranged between the gate electrode GE and the source electrode SE and between the gate electrode GE and the drain electrode DE. A third interlayer insulating layer 119 may be disposed over the source electrode SE and the drain electrode DE.

The semiconductor layer Act may include polysilicon. In some embodiments, the semiconductor layer Act may include amorphous silicon. In some embodiments, the semiconductor layer Act may include an oxide semiconductor of at least one of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The semiconductor layer Act may include a channel area that are undoped, and a source area and a drain area that are doped with dopants.

The capacitor Cst may be arranged to overlap the thin film transistor TFT. The capacitor Cst may include a lower electrode CE1 and an upper electrode CE2 overlapping each other in a plan view. When necessary, the gate electrode GE of the thin film transistor TFT may constitute the lower electrode CE1 of the capacitor Cst.

The gate electrode GE or the lower electrode CE1 may include a low-resistance conductive material such as molybdenum (Mo), aluminum (Al), copper (Cu), and/or titanium (Ti) and may have a single-layer or multiple-layer structure including the above material. For example, the gate electrode GE or the lower electrode CE1 may have a three-layer structure of Mo/Al/Mo.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and may have a single-layer or multiple-layer structure including the above material. For example, the upper electrode CE2 may have a three-layer structure of Ti/Al/Ti. The first interlayer insulating layer 115 may be arranged between the lower electrode CE1 and the upper electrode CE2.

The source electrode SE and/or the drain electrode DE may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and may have a single-layer or multiple-layer structure including the above material. For example, the source electrode SE and/or the drain electrode DE may have a three-layer structure of Ti/Al/Ti.

Each of the gate insulating layer 113, the first interlayer insulating layer 115, the second interlayer insulating layer 117, and the third interlayer insulating layer 119 may include an inorganic insulating material such as silicon oxide, silicon nitride, or silicon oxynitride and may have a single-layer or multiple-layer structure including the above material.

A planarization layer 121 may be disposed over the third interlayer insulating layer 119. The planarization layer 121 may include an organic material such as acryl, benzocyclobutene (BCB), polyimide, or hexamethyldisiloxane (HMDSO). Alternatively, the planarization layer 121 may include an inorganic material. The planarization layer 121 may function as a protection layer covering the first to seventh transistors T1 to T7, and an upper portion of the planarization layer 121 may be flat. The planarization layer 121 may have a single-layer or multiple-layer structure.

A plurality of lines WL may be arranged between the gate insulating layer 113, the first interlayer insulating layer 115, the second interlayer insulating layer 117, the third interlayer insulating layer 119, and/or the planarization layer 121. The plurality of lines WL may include a data line, a scan line, or an emission control line connected to the thin film transistor TFT and the capacitor Cst.

A connection electrode CML may be disposed over the third interlayer insulating layer 119. The thin film transistor TFT may be electrically connected to a first electrode 210 of the corresponding organic light emitting diode through the connection electrode CML. The connection electrode CML may be connected to the thin film transistor TFT through a contact hole in the third interlayer insulating layer 119, and the first electrode 210 may be connected to the connection electrode CML through a contact hole in the planarization layer 121.

Each of the first organic light emitting diode OLED1 and the second organic light emitting diode OLED2 may include a multilayered structure including a first electrode 210 as a pixel electrode, an emission layer 222, and a second electrode 230 as an opposite electrode. The multilayered structure may further include a first functional layer 221 disposed between the first electrode 210 and the emission layer 222 and/or a second functional layer 223 disposed between the emission layer 222 and the second electrode 230.

The first electrode 210 may be located over the planarization layer 121. The first electrode 210 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. The first electrode 210 may include a reflective layer including the above material, and a transparent conductive layer disposed over and/or under the reflective layer. The transparent conductive layer may include indium tin oxide (ITO), indium zinc oxide (IZO), zinc oxide (ZnO), indium oxide ($In_2O_3$), indium gallium oxide (IGO), or aluminum zinc oxide (AZO). In an embodiment, the first electrode 210 may include a three-layer structure of ITO layer/Ag layer/ITO layer.

A pixel definition layer 123 covering the edge of the first electrode 210 may include an opening overlapping a center portion of the first electrode 210. FIGS. 8 and 9 illustrate that the pixel definition layer 123 includes a through hole (hereinafter referred to as a first through hole 123OP1) exposing the first electrode (or referred as to main pixel electrode) 210 of the first organic light emitting diode OLED1 and a through hole (hereinafter referred to as a second through hole 123OP2) exposing the first electrode (or referred as to sub pixel electrode) 210 of the second organic light emitting diode OLED2.

The first through hole 123OP1 and the second through hole 123OP2 of the pixel definition layer 123 may define an emission area of the first organic light emitting diode OLED1 and an emission area of the second organic light emitting diode OLED2. For example, the width of the first through hole 123OP1 of the pixel definition layer 123 may correspond to the width of the emission area of the first organic light emitting diode OLED1, and the width of the second through hole 123OP2 of the pixel definition layer 123 may correspond to the width of the emission area of the second organic light emitting diode OLED2.

The pixel definition layer 123 may include a light-blocking insulating material. Accordingly, the pixel definition layer 123 may be a colored opaque light-blocking insulating layer, for example, may have a black color. For example, the pixel definition layer 123 may include a polyimide (PI)-based binder and a pigment in which red, green, and blue colors are mixed. Alternatively, the pixel definition layer 123 may include a cardo-based binder resin and a mixture of lactam-based black pigment and blue pigment. Alternatively, the pixel definition layer 123 may include a carbon black. The pixel definition layer 123 may prevent the reflection of external light together with an antireflection layer 600 described below and may improve the contrast of the display panel.

Main spacers MS (see FIG. 7) and sub spacers SS (see FIG. 7) may be disposed over the pixel definition layer 123. The main spacers MS may include a first main spacer MS1 and a second main spacer MS2. The second main spacer MS2 is illustrated in FIG. 8. The first main spacer MS1 (see FIG. 7) may have the same/similar shape as the second main spacer MS2, and a first sub spacer SS1 (see FIG. 7) and a second sub spacer SS2 (see FIG. 7) included in the sub spacer SS may also have the same/similar shape as the second main spacer MS2. That is, when viewed in the direction (the z-axis direction) perpendicular to the substrate 100, an area of each of the main spacers MS may be equal to an area of each of the sub spacers SS. Also, when viewed in the direction (the z-axis direction) perpendicular to the substrate 100, the shape of the cross-section of each of the main spacers MS may be the same as the shape of the cross-section of each of the sub spacers SS.

Hereinafter, the second main spacer MS2 illustrated in FIG. 8 will be described. However, this description may also be applied to the first main spacer MS1, the first sub spacer SS1, and the second sub spacer SS2.

The second main spacer MS2 may include a different material than the pixel definition layer 123. For example, the pixel definition layer 123 and the second main spacer MS2 may include different materials (e.g., the pixel definition layer 123 may include a negative photosensitive material and the second main spacer MS2 may include a positive photosensitive material) and may be respectively formed through separate mask processes. The second main spacer MS2 may be a transparent insulating layer.

The emission layer 222 may be located corresponding to each of the first through hole 123OP1 and the second through hole 123OP2 of the pixel definition layer 123 and may overlap the first electrode 210. The emission layer 222 may include a high-molecular or low-molecular weight organic material for emitting light of a certain color. The first functional layer 221 and the second functional layer 223 may be located under and over the emission layer 222.

The first functional layer 221 may include a hole transport layer (HTL) and/or a hole injection layer (HIL). The second functional layer 223 may include an electron transport layer (ETL) and/or an electron injection layer (EIL). Unlike the emission layer 222, the first functional layer 221 and/or the second functional layer 223 may be integrally formed in several pixels. That is, the first functional layer 221 and/or the second functional layer 223 may be integrally formed in the main display area MDA and the component area CA.

The thin film encapsulation layer 300 may cover the first organic light emitting diode OELD1 and the second organic light emitting diode OLED2. The thin film encapsulation layer 300 may include a first inorganic encapsulation layer 310 and a second inorganic encapsulation layer 330 and an organic encapsulation layer 320 disposed therebetween.

Each of the first inorganic encapsulation layer 310 and the second inorganic encapsulation layer 330 may include one or more inorganic insulating materials. The inorganic insulating material may include aluminum oxide, titanium oxide, tantalum oxide, hafnium oxide, zinc oxide, silicon oxide, silicon nitride, and/or silicon oxynitride.

The organic encapsulation layer 320 may include a polymer-based material. The polymer-based material may include acryl-based resin, epoxy-based resin, polyimide, and/or polyethylene. For example, the organic encapsulation layer 320 may include acryl-based resin such as polymethylmethacrylate and/or polyacrylic acid. The organic encapsulation layer 320 may be formed by curing a monomer or applying a polymer.

The touch screen layer 400 may include a touch electrode, and the touch electrode may include a conductive layer ML. The touch electrode may include a conductive layer ML having a mesh structure surrounding the emission areas of the first organic light emitting diode OLED1 and the second organic light emitting diode OLED2 in the plan view. The conductive layer ML may include a connection structure of a first conductive layer ML1 and a second conductive layer ML2 as illustrated in FIGS. 8 and 9. In other embodiments, the conductive layer ML may include one of the first conductive layer ML1 and the second conductive layer ML2. The conductive layer ML may include molybdenum (Mo), silver (Ag), titanium (Ti), copper (Cu), aluminum (Al), or any alloy thereof. The electrode of the touch screen layer 400, for example, the conductive layer ML, may be covered by the light blocking layer 610.

The touch screen layer 400 may include a first touch insulating layer 401 disposed over the thin film encapsulation layer 300, a second touch insulating layer 403 disposed over the first touch insulating layer 401, and a third touch insulating layer 405 disposed over the second touch insulating layer 403. The first conductive layer ML1 may be arranged between the first touch insulating layer 401 and the second touch insulating layer 403, and the second conductive layer ML2 may be arranged between the second touch insulating layer 403 and the third touch insulating layers 405.

The first touch insulating layer 401 to the third touch insulating layer 405 may include an inorganic insulating material and/or an organic insulating material. For example, the first touch insulating layer 401 and the second touch insulating layer 403 may include an inorganic insulating material, and the third touch insulating layer 405 may include an organic insulating material.

The light blocking layer 610 of the antireflection layer 600 may include openings exposing the emission areas of the first organic light emitting diode OLED1 and the second organic light emitting diode OLED2. FIG. 8 illustrates an opening (hereinafter referred to as a first opening 610OP1) exposing the emission area of the first organic light emitting diode OLED1 and/or formed in an area corresponding to the first through hole 123OP1 of the pixel definition layer 123, and FIG. 9 illustrates an opening (hereinafter referred to as a second opening 610OP2) exposing the emission area of the second organic light emitting diode OLED2 and/or formed in an area corresponding to the second through hole 123OP2 of the pixel definition layer 123.

The width of the first opening 610OP1 of the light blocking layer 610 may be greater than or equal to the width of the emission area of the first organic light emitting diode OLED1 and/or the first through hole 123OP1 of the pixel definition layer 123. FIG. 8 illustrates that the width of the first opening 610OP1 of the light blocking layer 610 is greater than the width of the emission area of the first organic light emitting diode OLED1 and/or the first through hole 123OP1 of the pixel definition layer 123.

Likewise, the width of the second opening 610OP2 of the light blocking layer 610 may be greater than or equal to the width of the emission area of the second organic light emitting diode OLED2 and/or the second through hole 123OP2 of the pixel definition layer 123. FIG. 9 illustrates that the width of the second opening 610OP2 of the light blocking layer 610 is greater than the width of the emission area of the second organic light emitting diode OLED2 and/or the second through hole 123OP2 of the pixel definition layer 123.

A color filter 620 may be located in the first opening 610OP1 and the second opening 610OP2 of the light blocking layer 610. FIGS. 8 and 9 illustrate that a first color filter 620a is located in the first opening 610OP1 and the second opening 610OP2 in the case of the red pixel Pr and a third color filter 620c is located in the first opening 610OP1 and the second opening 610OP2 in the case of the blue pixel Pb. The color filter 620 may selectively transmit only light of a particular wavelength band among the wavelength of light emitted from the organic light emitting diode arranged thereunder. For example, as illustrated in FIG. 8, when any one first organic light emitting diodes OLED1 of the main display area MDA emits red light, the color filter 620 arranged in the first opening 610OP1 to overlap the first organic light emitting diode OLED1 may transmit red light and may not transmit most of green light or blue light. For example, as illustrated in FIG. 9, when any one second organic light emitting diodes OLED2 of the component area CA emits blue light, the color filter 620 arranged in the second opening 610OP2 to overlap the second organic light emitting diode OLED2 may transmit blue light and may not transmit most of red light or green light.

The overcoat layer 630 may be disposed over the light blocking layer 610 and the color filter 620. The overcoat layer 630 may be a transparent layer and may planarize the upper surface of the light blocking layer 610 and the upper surface of the color filter 620. The overcoat layer 630 may include a transparent organic material such as an acryl-based resin.

As illustrated in FIG. 9, a transmission area TA may be located between two adjacent second organic light emitting diodes OLED2 among a plurality of second organic light emitting diodes OLED2 arranged in the component area CA. The transmission area TA may be an area in which light blocking elements such as circuit elements and/or lines connected thereto are not arranged.

In order to form the transmission area TA in the component area CA while maintaining the resolution of the component area CA to be equal to the resolution of the main display area MDA, the distance between the pixel circuit elements of the component area CA and/or the lines WL connected thereto may be less than the distance between the pixel circuit elements of the main display area MDA and/or the lines WL connected thereto.

The pixel definition layer 123 may include a through hole (hereinafter referred to as a third through hole 123OP3) corresponding to the transmission area TA, and the light blocking layer 610 may also include an opening (hereinafter referred to as a third opening 610OP3) corresponding to the transmission area TA. The color filter 620 may not be arranged in the third opening 610OP3, and a portion of the overcoat layer 630 may be located therein. For example, the overcoat layer 630 may at least partially fill the third opening 610OP3 and may entirely cover the light blocking layer 610 and the color filters 620. The third opening 610OP3 may be formed in an area corresponding to the third through hole 123OP3, and the size (or width) of the third opening 610OP3 may be greater than the size (or width) of the third through hole 123OP3. The third through hole 123OP3 of the pixel definition layer 123 may be referred to as a transmission hole because it corresponds to the transmission area TA.

The first functional layer 221 and the second functional layer 223 may also be in a portion corresponding to the transmission area TA. On the other hand, the second electrode 230 including metal elements may include a through hole (hereinafter referred to as a fourth through hole 230OP) corresponding to the transmission area TA. The transmittance of the transmission area TA may be improved by the fourth through hole 230OP. The size (or width) of the fourth through hole 230OP of the second electrode 230 may be less than the size (or width) of the third through hole 123OP3.

The bottom metal layer BML may include a through hole (hereinafter referred to as a fifth through hole BML_OP) overlapping the transmission area TA, and the size (or width) of the fifth through hole BML_OP may be greater than the size (or width) of the third through hole 123OP3.

In an embodiment, the distance between the first conductive layers ML1 and the distance between the second conductive layers ML2 of the touch screen layer 400 in the component area CA may be different from the distance between the first conductive layers ML1 and the distance between the second conductive layers ML2 in the main display area MDA such that an area corresponding to the transmission area TA may be defined in the touch screen layer 400 in the component area CA. For example, the distance between the first conductive layers ML1 and the distance between the second conductive layers ML2 of the touch screen layer 400 in the component area CA may be less than the distance between the first conductive layers ML1 and the distance between the second conductive layers ML2 in the main display area MDA.

Because the pixel circuit, the line, the pixel definition layer 123 of an opaque material, and the light blocking layer 610 are not included in an area corresponding to the transmission area TA of the display panel, the transmittance of the component area CA may be improved while maintaining the resolution of the component area CA to be equal to the resolution of the main display area MDA.

The first main spacer MS1, the first sub spacer SS1, and the second sub spacer SS2 as well as the second main spacer MS2 illustrated in FIG. 8 may prevent the pixel defining layer 123 from being damaged in the process of forming the emission layer 222 or the like. When the emission layer 222 is formed after the first electrode 210 and the pixel definition layer 123 are formed, a fine metal mask (FMM) having an opening of a certain pattern formed therein is located over the pixel definition layer 123 and a material for forming the emission layer 222 or the like may be deposited on the first electrode 210 through the opening of the fine metal mask. In this case, when the fine metal mask directly contacts the first electrode 210 or the pixel definition layer 123, the first electrode 210 or the pixel definition layer 123 may be damaged and thus a defect may occur in the first electrode 210 or the pixel definition layer 123. The first main spacer MS1, the second main spacer MS2, the first sub spacer SS1, and the second sub spacer SS2 may support the fine metal mask by contact the fine metal mask in the deposition process, thereby preventing the first electrode 210 or the pixel definition layer 123 from being damaged.

In the case of the display apparatus according to the present embodiment, as illustrated in FIG. 7, when viewed in the direction (the z-axis direction) perpendicular to the substrate 100, the number per unit area of main spacers MS disposed over the pixel definition layer 123 in the main display area MDA may be equal to the number per unit area of sub spacers SS disposed over the pixel definition layer 123 in the component area CA. Accordingly, in both the main display area MDA and the component area CA, the fine metal mask may be uniformly supported by the main spacers MS and the sub spacers SS and thus a defect in the display apparatus in the manufacturing process may be effectively prevented.

When the number per unit area of sub spacers SS disposed over the pixel definition layer 123 in the component area CA is less than the number per unit area of main spacers MS disposed over the pixel definition layer 123 in the main display area MDA, the weight of the fine metal mask applied to the sub spacers SS may be greater than the weight of the fine metal mask applied to the main spacers MS and thus some of the sub spacers SS may be collapsed. In this case, the fine metal mask may damage the pixel definition layer 123 or the first electrode 210 in a portion where the collapsed sub spacers SS exist, thus causing a defect in the display apparatus.

In the case of the display apparatus according to the present embodiment, as described above, the number per unit area of main spacers MS disposed over the pixel definition layer 123 in the main display area MDA may be equal to the number per unit area of sub spacers SS disposed over the pixel definition layer 123 in the component area CA. Thus, the occurrence of the defect described above may be effectively prevented. The shape of the main spacers MS and the shape of the sub spacers SS may be different from each other.

In the main display area MDA, the main spacers MS may include first main spacers MS1 arranged at certain intervals and second main spacers MS2 arranged at certain intervals as illustrated in FIG. 7. In this case, the first main spacers MS1 and the second main spacers MS2 may be in a one-to-one correspondence to each other. Particularly, a distance Dms1 between the first main spacers MS1 in the first direction and the second direction may be equal to a distance Dms2 between the second main spacers MS2 in the first direction and the second direction. Also, each of the first main spacers MS1 may be located adjacent to a corresponding one of the second main spacers MS2.

Accordingly, FIG. 7 illustrates that sets of one first main spacer MS1 and one second main spacer MS2 are arranged at certain intervals in the main display area MDA. That is, when considering the green pixels Pg arranged in one row extending in the first direction (the x-axis direction), FIG. 7 illustrates that the first main spacers MS1 are arranged adjacent to every fourth green pixel Pg. Also, it is illustrated that second main spacers MS2 are arranged in the areas between the red pixels Pr and the blue pixels Pb in a column corresponding to the green pixels Pg adjacent to the first main spacers MS1.

In the component area CA, the sub spacers SS may include first sub spacers SS1 arranged at certain intervals and second sub spacers SS2 arranged at certain intervals, and the first sub spacers SS1 and the second sub spacers SS2 may be in a one-to-one correspondence to each other. In this case, a distance Dss1 between the first sub spacers SS1 in a first direction and a second direction may be equal to a distance Dss2 between the second sub spacers SS2 in a first direction and a second direction. Accordingly, the distance between the first sub spacers SS1 and the second sub spacers SS2 may be constant. FIG. 7 illustrates that the arrangement of the sub spacers SS forms a grid arrangement of certain intervals.

The distance Dms1 between the first main spacers MS1, the distance Dms2 between the second main spacers MS2, the distance Dss1 between the first sub spacers SS1, and the distance Dss2 between the second sub spacers SS2 may be equal to one another as illustrated in FIG. 7.

Moreover, because the transmission areas TA are included in the component area CA as described above, the arrangement of the main spacers MS arranged in the main display area MDA may be different from the arrangement of the sub spacers SS arranged in the component area CA. Particularly, the first main spacers MS1 in the main display area MDA may be disposed in areas correspond to the first sub spacers SS1 in the component area CA. The second main spacers MS2 in the main display area MDA may not be disposed in areas corresponding to the second sub spacers SS2 in the component area CA but may be disposed in areas corresponding to the transmission areas TA in the component area CA. That is, the position of the second main spacers MS2 in the main display area MDA may correspond to the position of the third through holes 123OP3 that are the transmission holes of the pixel definition layer 123. The position of the second main spacers MS2 may not correspond to all of the positions of the transmission holes of the pixel definition layer 123 in the component area CA but may correspond to part of the positions of the transmission holes of the pixel definition layer 123 in the component area CA. This may allow the number of main spacers MS per unit area disposed over the pixel definition layer 123 in the main display area MDA to be equal to the number of sub spacers SS per unit area disposed over the pixel definition layer 123 in the component area CA as described above.

Figure 10:
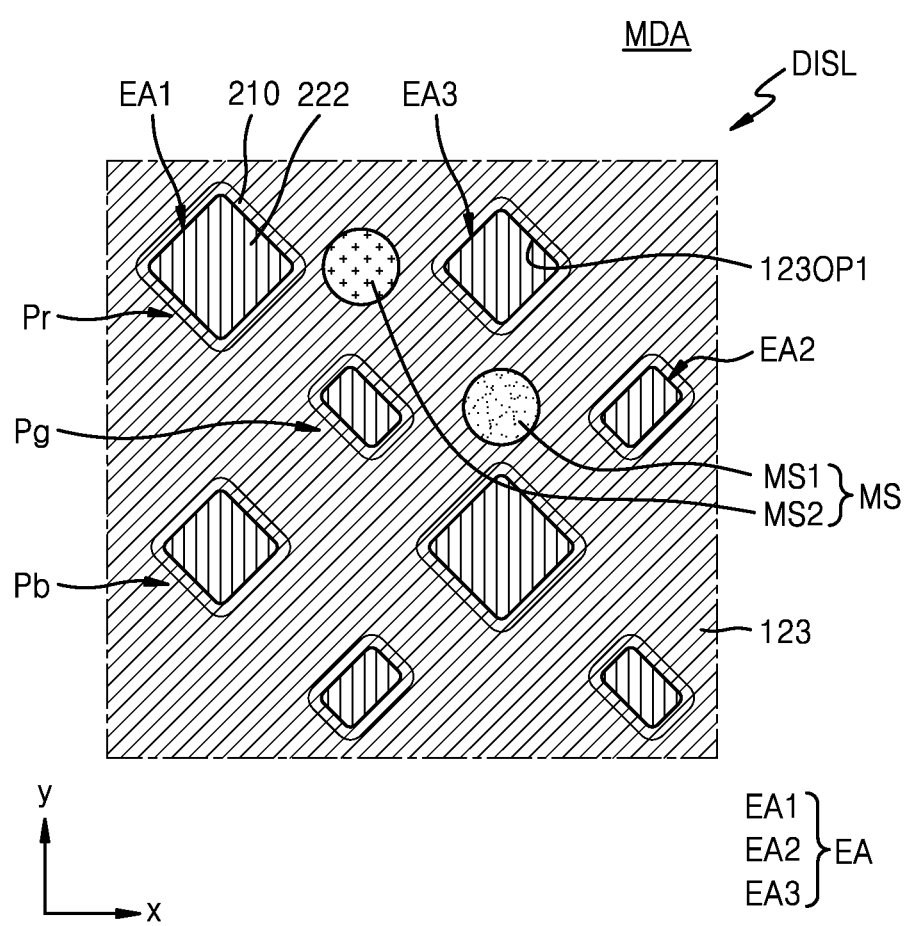
FIG. 10 is a plan view schematically illustrating a display layer in a main display area of the display apparatus of FIG. 7.
Figure 11:
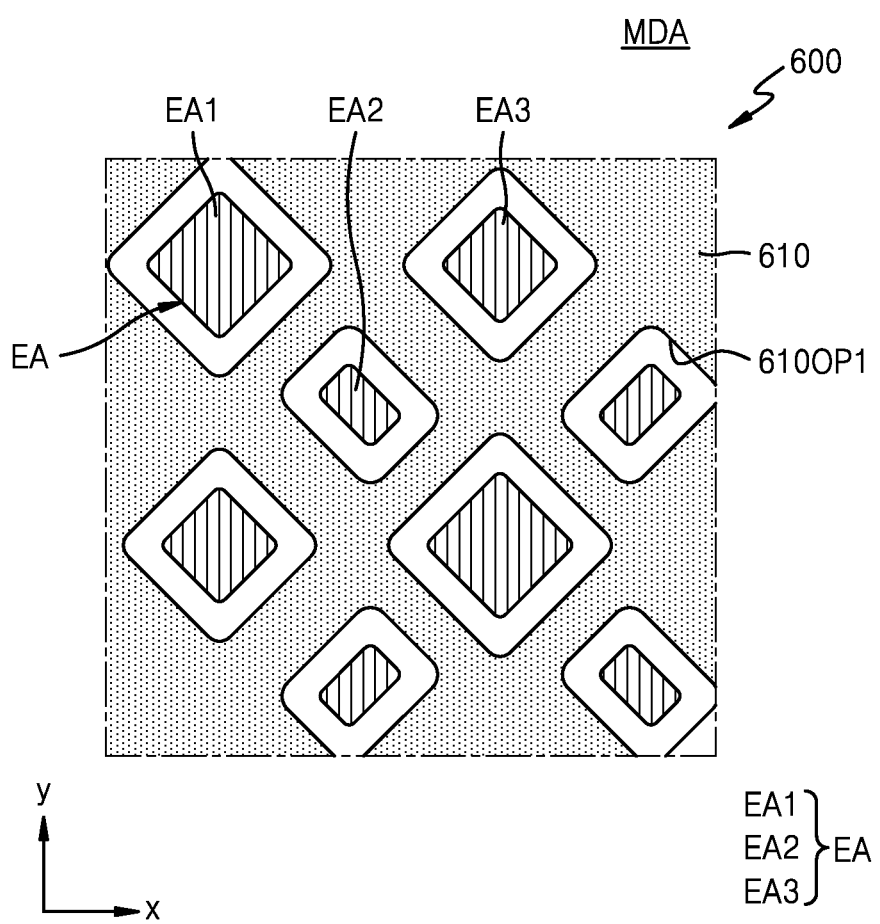
FIGS. 11 and 12 are plan views schematically illustrating an antireflection layer in a main display area of the display apparatus of FIG. 7.
Figure 12:
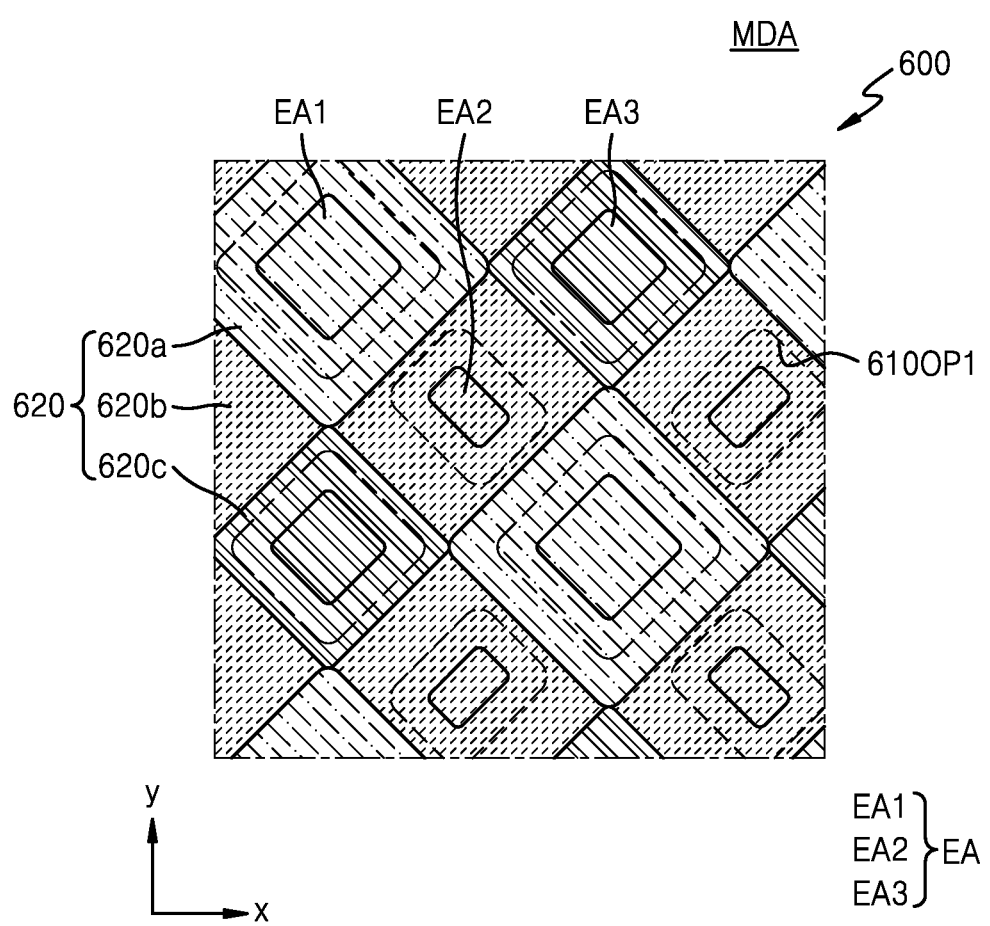

FIG. 10 is a plan view schematically illustrating a display layer in the main display area of the display apparatus of FIG. 7, and FIGS. 11 and 12 are plan views schematically illustrating an antireflection layer in the main display area of the display apparatus of FIG. 7.

As illustrated in FIG. 10, the first electrodes 210 of the red pixel Pr, the green pixel Pg, and the blue pixel Pb may be disposed over the planarization layer 121 of the main display area MDA. The pixel definition layer 123 covering edges of the first electrodes 210 may be arranged between the first electrodes 210. The pixel definition layer 123 may include first through holes 123OP1 exposing a portion of the first electrodes 210. The emission layer 222 may be disposed over the first electrode 210 exposed by the first through hole 123OP1. An emission area EA corresponding to the emission layer 222 may be defined as a portion of the first electrode 210 exposed by the first through hole 123OP1 of the pixel definition layer 123.

The emission area EA may include a first emission area EA1 corresponding to the red pixel Pr, a second emission area EA2 corresponding to the green pixel Pg, and a third emission area EA3 corresponding to the blue pixel Pb. The main spacer MS may be arranged between the emission areas EA over the pixel definition layer 123. The first main spacers MS1 and the second main spacers MS2 may form pairs disposed adjacent to each other as illustrated in FIGS. 7 and 10, and the pairs may be arranged at certain intervals in the main display area MDA.

As illustrated in FIG. 11, the light blocking layer 610 may surround the emission area EA and may have a shape corresponding to the pixel definition layer 123. The light blocking layer 610 may include a first opening 610OP1 in a region corresponding to the emission area EA. The area of the first opening 610OP1 may be greater than the area of the emission area EA.

As illustrated in FIG. 12, the color filter 620 may include a first color filter 620a selectively transmitting red light, a second color filter 620b selectively transmitting green light, and a third color filter 620c selectively transmitting blue light. The first color filter 620a may be arranged corresponding to the first emission area EA1, the second color filter 620b may be arranged corresponding to the second emission area EA2, and the third color filter 620c may be arranged corresponding to the third emission area EA3. The first color filter 620a, the second color filter 620b, and the third color filter 620c may be arranged adjacent to each other. In an embodiment, edges of each of the first color filter 620a, the second color filter 620b, and the third color filter 620c may partially overlap the light blocking layer 610. The edges of each of the first color filter 620a, the second color filter 620b, and the third color filter 620c may overlap the edges of the first color filter 620a, the second color filter 620b, and the third color filter 620c adjacent thereto. Each of the first color filter 620a, the second color filter 620b, and the third color filter 620c may be an isolated pattern. Each of the first color filter 620a, the second color filter 620b, and the third color filter 620c may partially overlap the pixel definition layer 123.

Figure 13:
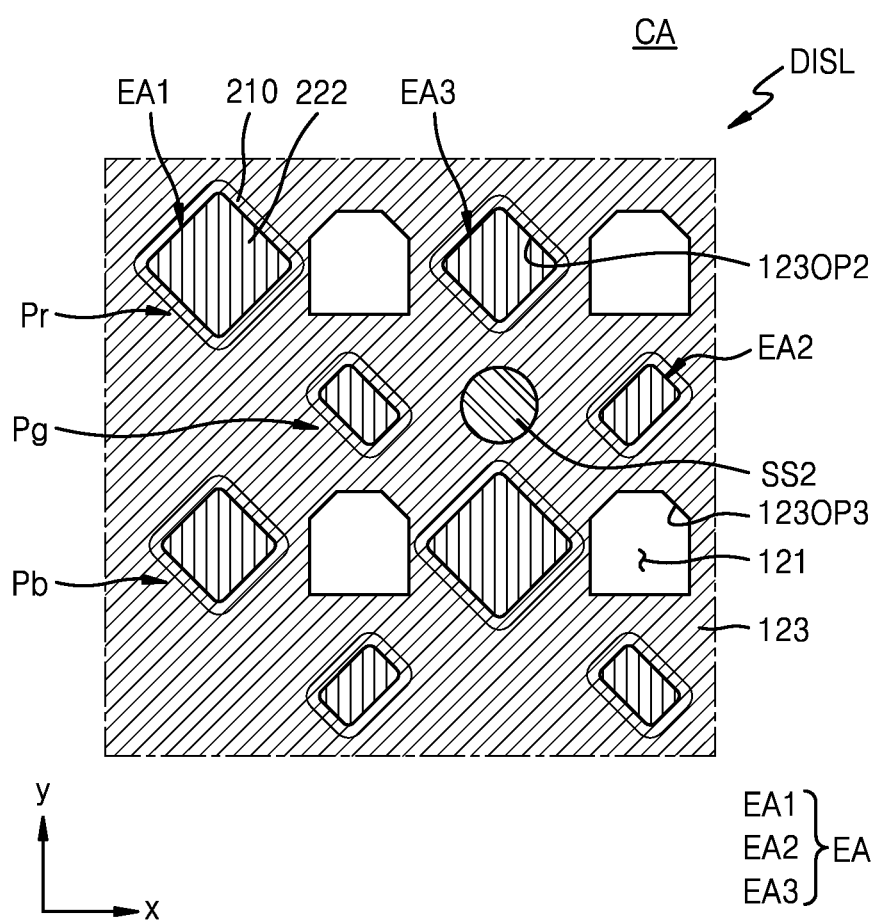
FIG. 13 is a plan view schematically illustrating a display layer in a component area of the display apparatus of FIG. 7.
Figure 14:
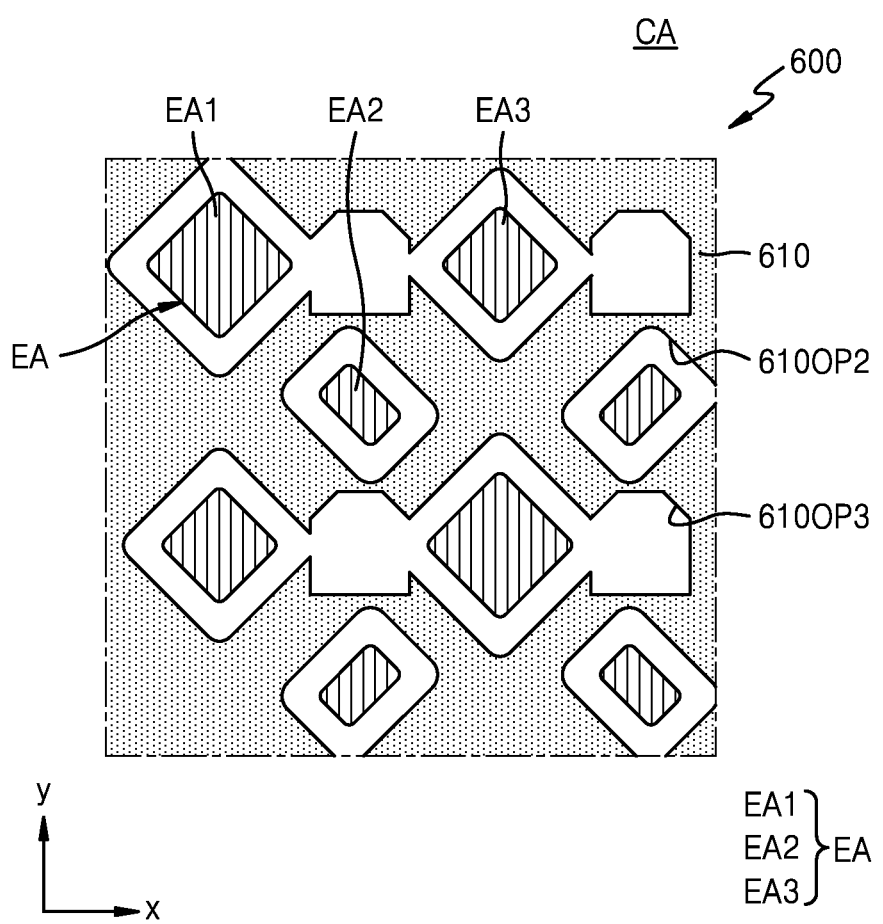
FIGS. 14 and 15 are plan views schematically illustrating an antireflection layer in a component area of the display apparatus of FIG. 7.
Figure 15:
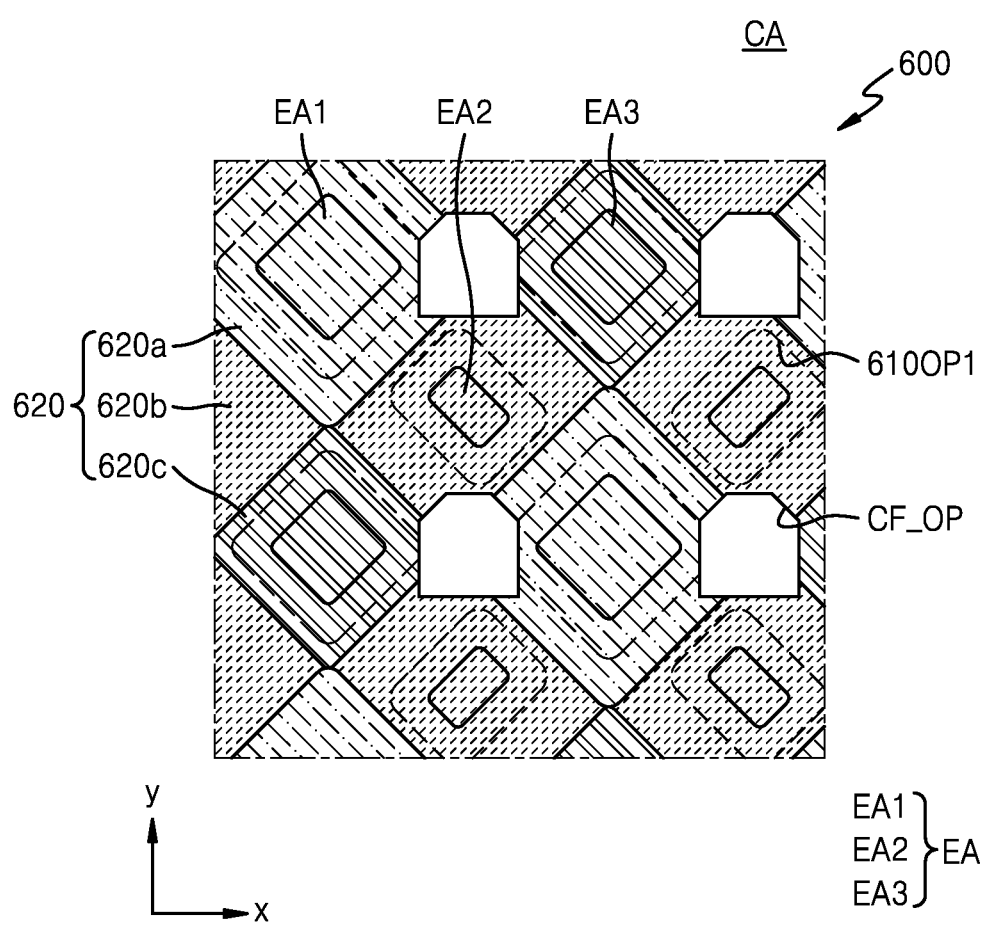

FIG. 13 is a plan view schematically illustrating a display layer in the component area of the display apparatus of FIG. 7, and FIGS. 14 and 15 are plan views schematically illustrating an antireflection layer in the component area of the display apparatus of FIG. 7.

As illustrated in FIG. 13, the first electrodes 210 of the red pixel Pr, the green pixel Pg, and the blue pixel Pb may be disposed over the planarization layer 121 in the component area CA. The pixel definition layer 123 covering the edges of the first electrodes 210 may be arranged between the first electrodes 210. The pixel definition layer 123 may include second through holes 123OP2 exposing a portion of the first electrodes 210. The emission layer 222 may be disposed over the first electrode 210 exposed by the second through hole 123OP2. An emission area EA may be defined as a portion of the first electrode 210 exposed by the second through hole 123OP2 of the pixel definition layer 123.

The emission area EA may include a first emission area EA1 corresponding to the red pixel Pr, a second emission area EA2 corresponding to the green pixel Pg, and a third emission area EA3 corresponding to the blue pixel Pb. The pixel definition layer 123 may include a third through hole 123OP3 disposed in an area corresponding to the transmission area TA. A portion of the planarization layer 121 disposed thereunder may be exposed by the third through hole 123OP3. The shape of the third through hole 123OP3 of the pixel definition layer 123 may correspond to the shape of the transmission area TA. FIG. 13 illustrates a case where the third through hole 123OP3 of the pixel definition layer 123 has a polygonal shape when viewed in the direction (the z-axis direction) perpendicular to the substrate 100.

The sub spacer SS may be arranged between the emission areas EA over the pixel definition layer 123. FIG. 13 illustrates that the second sub spacer SS2 is disposed over the pixel definition layer 123. As described above with reference to FIG. 7, the arrangement structure of the sub spacers SS in the component area CA may have a grid shape when viewed in the direction (the z-axis direction) perpendicular to the substrate 100. Also, the number of sub spacers SS per unit area may be equal to the number of main spacers MS per unit area when viewed in the direction (the z-axis direction) perpendicular to the substrate 100.

As illustrated in FIG. 14, the light blocking layer 610 may surround the emission area EA and may have a shape corresponding to the pixel definition layer 123. The light blocking layer 610 may include a second opening 610OP2 corresponding to the emission area EA. The area of the second opening 610OP2 may be greater than the area of the emission area EA. The light blocking layer 610 may cover the first conductive layer ML1 and the second conductive layer ML2 in a plan view. The light blocking layer 610 may include a third opening 610OP3 disposed in a region corresponding to the transmission area TA. The third opening 610OP3 of the light blocking layer 610 may be disposed in a region corresponding to the third through hole 123OP3 of the pixel definition layer 123. That is, the third opening 610OP3 of the light blocking layer 610 may overlap the third through hole 123OP3 of the pixel definition layer 123. The shape of the third opening 610OP3 of the light blocking layer 610 may correspond to the shape of the transmission area TA. FIG. 14 illustrates that the third opening 610OP3 of the light blocking layer 610 has a polygonal shape. As illustrated in FIG. 14, the third opening 610OP3 may be connected to the second opening 610OP2.

As illustrated in FIG. 15, the color filter 620 may include a through portion CF_OP corresponding to the transmission area TA. The through portion CF_OP may be disposed in a region corresponding to the third opening 610OP3 of the light blocking layer 610 and may overlap the third opening 610OP3. The first color filter 620a may be arranged in an area corresponding to the first emission area EA1, the second color filter 620b may be arranged in an area corresponding to the second emission area EA2, and the third color filter 620c may be arranged in an area corresponding to the third emission area EA3. The first color filter 620a, the second color filter 620b, and the third color filter 620c may be arranged adjacent to each other. For example, the edges of each of the first color filter 620a, the second color filter 620b, and the third color filter 620c may overlap the edges of the first color filter 620a, the second color filter 620b, and the third color filter 620c adjacent thereto. The edges of each of the first color filter 620a, the second color filter 620b, and the third color filter 620c may partially overlap the light blocking layer 610. Each of the first color filter 620a, the second color filter 620b, and the third color filter 620c may be an isolated pattern. Each of the first color filter 620a, the second color filter 620b, and the third color filter 620c may partially overlap the pixel definition layer 123.

It has been described above that the number of main spacers MS disposed over the pixel definition layer 123 per unit area in the main display area MDA is equal to the number of sub spacers SS disposed over the pixel definition layer 123 per unit area in the component area CA when viewed in the direction (the z-axis direction) perpendicular to the substrate 100. However, the disclosure is not limited thereto.

For example, when viewed in the direction (the z-axis direction) perpendicular to the substrate 100, the area occupied by the main spacers MS disposed over the pixel definition layer 123 per unit area in the main display area MDA may be equal to the area occupied by the sub spacers SS disposed over the pixel definition layer 123 per unit area in the component area CA. Accordingly, in both the main display area MDA and the component area CA, the fine metal mask may be uniformly supported by the main spacers MS and the sub spacers SS and thus a defect in the display apparatus in the manufacturing process may be effectively prevented. The above various descriptions may also be applied to a case where the area occupied by the main spacers MS disposed over the pixel definition layer 123 per unit area in the main display area MDA is equal to the area occupied by the sub spacers SS disposed over the pixel definition layer 123 per unit area in the component area CA.

Moreover, in this case, the shape of the main spacers MS and the shape of the sub spacers SS may be different from each other.

According to an embodiment described above, a display apparatus having a low defect in a manufacturing process while being capable of displaying a high-quality image may be implemented. However, the scope of the disclosure is not limited to these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a substrate including a component area and a main display area disposed only outside the component area, the component area including sub display areas and transmission areas, and the main display area at least partially surrounding the component area;
main pixel electrodes disposed in the main display area and spaced apart from each other;
sub pixel electrodes disposed in the sub display areas and spaced apart from each other, the transmission areas being disposed between the sub pixel electrodes in the component area;
a pixel definition layer including openings in areas corresponding to the main pixel electrodes and the sub pixel electrodes, covering an edge of each of the main pixel electrodes and an edge of each of the sub pixel electrodes, and including transmission holes in areas corresponding to the transmission areas;
main spacers disposed on the pixel definition layer in the main display area; and
sub spacers disposed on the pixel definition layer in the component area,
wherein a number of the sub spacers per unit area is equal to a number of the main spacers per unit area in a plan view.

2. The display apparatus of claim 1, wherein an area of each of the main spacers is equal to an area of each of the sub spacers in the plan view.

3. The display apparatus of claim 1, wherein a shape of an area of each of the main spacers is same as a shape of an area of each of the sub spacers in a plan view.

4. The display apparatus of claim 1, wherein the main spacers include first main spacers arranged at a certain interval from one another and second main spacers arranged at a certain interval from one another, and the first main spacers and the second main spacers are in a one-to-one correspondence to each other.

5. The display apparatus of claim 4, wherein a distance between the first main spacers is equal to a distance between the second main spacers.

6. The display apparatus of claim 4, wherein each of the first main spacers is disposed adjacent to a corresponding one of the second main spacers.

7. The display apparatus of claim 6, wherein the sub spacers include first sub spacers arranged at a certain interval from one another and second sub spacers arranged at a certain interval from one another, and the first sub spacers and the second sub spacers are in a one-to-one correspondence to each other.

8. The display apparatus of claim 7, wherein a distance between the first sub spacers is equal to a distance between the second sub spacers.

9. The display apparatus of claim 7, wherein a distance between each of the first sub spacers and each of the second sub spacers is uniform.

10. The display apparatus of claim 7, wherein the first sub spacers in the sub display area are disposed in areas corresponding to the first main spacers in the main display area.

11. The display apparatus of claim 7, wherein the transmission holes of the pixel definition layer in the sub display area are disposed in areas corresponding to the second main spacers in the main display area.

12. The display apparatus of claim 7, wherein the second main spacers in the main display area are disposed in areas corresponding to some of the transmission holes of the pixel definition layer in the sub display area.

13. The display apparatus of claim 1, further comprising an antireflection layer disposed over the main pixel electrodes and the sub pixel electrodes and including a light blocking layer and color filters,
wherein the light blocking layer includes openings corresponding to the transmission holes of the pixel definition layer.

14. The display apparatus of claim 1, wherein the pixel definition layer includes a light-blocking insulating material.

15. A display apparatus comprising:
a substrate including a component area and a main display area disposed only outside the component area, the component area including sub display areas and transmission areas, and the main display area at least partially surrounding the component area;
main pixel electrodes disposed in the main display area and spaced apart from each other;
sub pixel electrodes disposed in the sub display areas and spaced apart from each other, the transmission areas being disposed between the sub pixel electrodes in the component area;
a pixel definition layer including openings in areas corresponding to the main pixel electrodes and the sub pixel electrodes, covering an edge of each of the main pixel electrodes and an edge of each of the sub pixel electrodes, and including transmission holes corresponding to the transmission areas;
main spacers disposed on the pixel definition layer in the main display area; and
sub spacers disposed on the pixel definition layer in the component area,
wherein an area occupied by the sub spacers per unit area in the sub display area is equal to an area occupied by the main spacers per unit area in the main display area in a plan view.

16. The display apparatus of claim 15, wherein the main spacers include first main spacers arranged at a certain interval from one another and second main spacers arranged at a certain interval from one another, and the first main spacers and the second main spacers are in a one-to-one correspondence to each other.

17. The display apparatus of claim 16, wherein each of the first main spacers is disposed adjacent to a corresponding one of the second main spacers.

18. The display apparatus of claim 17, wherein the sub spacers include first sub spacers arranged at a certain interval from each other and second sub spacers arranged at a certain interval from each other, and the first sub spacers and the second sub spacers are in a one-to-one correspondence to each other.

19. The display apparatus of claim 18, wherein the first main spacers in the main display area are disposed in areas corresponding to the first sub spacers in the sub display area.

20. The display apparatus of claim 18, wherein the second main spacers in the main display area are disposed in areas corresponding to some of the transmission holes of the pixel definition layer in the sub display area.

* * * * *